United States Patent
Ching et al.

(10) Patent No.: US 11,139,381 B2
(45) Date of Patent: Oct. 5, 2021

(54) SEMICONDUCTOR DEVICE WITH GATE-ALL-AROUND (GAA) FETS HAVING INNER INSULATING SPACERS

(71) Applicant: TAIWAN SEMICONDUCTOR MANUFACTURING CO., LTD., Hsinchu (TW)

(72) Inventors: Kuo-Cheng Ching, Hsinchu County (TW); Ching-Wei Tsai, Hsinchu (TW); Kuan-Lun Cheng, Hsin-Chu (TW); Chih-Hao Wang, Baoshan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/655,079

(22) Filed: Oct. 16, 2019

(65) Prior Publication Data

US 2020/0052084 A1    Feb. 13, 2020

Related U.S. Application Data

(60) Continuation of application No. 16/206,730, filed on Nov. 30, 2018, now Pat. No. 10,861,952, which is a
(Continued)

(51) Int. Cl.
*H01L 29/423* (2006.01)
*H01L 29/06* (2006.01)
(Continued)

(52) U.S. Cl.
CPC .... *H01L 29/42392* (2013.01); *H01L 27/0924* (2013.01); *H01L 29/04* (2013.01);
(Continued)

(58) Field of Classification Search
CPC ..... H01L 21/823431; H01L 21/823821; H01L 27/0886; H01L 27/0924; H01L 29/41791;
(Continued)

(56) References Cited

U.S. PATENT DOCUMENTS 6,274,450 B1   8/2001  Lin et al.
9,209,247 B2  12/2015  Colinge et al.
(Continued)

FOREIGN PATENT DOCUMENTS

KR   10-2017-0003354 A   1/2017
KR   10-2017-0041605 A   4/2017
(Continued)

OTHER PUBLICATIONS

Office Action issued in U.S. Appl. No. 16/206,730, dated Apr. 13, 2020.
(Continued)

*Primary Examiner* — Younes Boulghassoul
(74) *Attorney, Agent, or Firm* — McDermott Will & Emery LLP

(57) ABSTRACT

In accordance with an aspect of the present disclosure, in a method of manufacturing a semiconductor device, a fin structure in which first semiconductor layers and second semiconductor layers are alternately stacked is formed. A sacrificial gate structure is formed over the fin structure. A first cover layer is formed over the sacrificial gate structure, and a second cover layer is formed over the first cover layer. A source/drain epitaxial layer is formed. After the source/drain epitaxial layer is formed, the second cover layer is removed, thereby forming a gap between the source/drain epitaxial layer and the first cover layer, from which a part of the fin structure is exposed. Part of the first semiconductor layers is removed in the gap, thereby forming spaces
(Continued)

between the second semiconductor layers. The spaces are filled with a first insulating material.

20 Claims, 36 Drawing Sheets

Related U.S. Application Data division of application No. 15/653,068, filed on Jul. 18, 2017, now Pat. No. 10,211,307.

(51) Int. Cl.
| | |
|---|---|
| *H01L 27/092* | (2006.01) |
| *H01L 29/04* | (2006.01) |
| *H01L 29/165* | (2006.01) |
| *H01L 29/78* | (2006.01) |
| *H01L 29/786* | (2006.01) |
| *H01L 29/66* | (2006.01) |

(52) U.S. Cl.
CPC ...... *H01L 29/0649* (2013.01); *H01L 29/0673* (2013.01); *H01L 29/165* (2013.01); *H01L 29/6653* (2013.01); *H01L 29/6656* (2013.01); *H01L 29/66439* (2013.01); *H01L 29/66545* (2013.01); *H01L 29/66553* (2013.01); *H01L 29/66795* (2013.01); *H01L 29/785* (2013.01); *H01L 29/7848* (2013.01); *H01L 29/78696* (2013.01)

(58) Field of Classification Search
CPC . H01L 29/66795–66818; H01L 29/785–7856; H01L 2029/7857–7858; H01L 29/42384–42392; H01L 29/0673; H01L 29/78696; H01L 29/42392; H01L 29/66439; H01L 29/6653; H01L 29/6656; H01L 29/66553; H01L 21/823468; H01L 21/823864; H01L 27/092–0924; H01L 21/845; H01L 27/1211
See application file for complete search history.

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,818,872 B2 | 11/2017 | Ching et al. | |
| 9,853,101 B2 | 12/2017 | Peng et al. | |
| 10,164,012 B2 | 12/2018 | Fung et al. | |
| 2006/0049429 A1 | 3/2006 | Kim et al. | |
| 2015/0090958 A1 | 4/2015 | Yang et al. | |
| 2015/0372104 A1 | 12/2015 | Liu et al. | |
| 2015/0372115 A1 | 12/2015 | Koh et al. | |
| 2016/0190339 A1 | 6/2016 | Xie et al. | |
| 2016/0204195 A1 | 7/2016 | Wen et al. | |
| 2016/0211322 A1 | 7/2016 | Kim et al. | |
| 2017/0005195 A1* | 1/2017 | Ching | H01L 29/165 |
| 2017/0077232 A1 | 3/2017 | Balakrishnan et al. | |
| 2017/0104061 A1* | 4/2017 | Peng | H01L 21/845 |
| 2017/0141112 A1* | 5/2017 | Ching | H01L 21/823807 |
| 2017/0154973 A1* | 6/2017 | Ching | H01L 29/0673 |
| 2017/0221893 A1* | 8/2017 | Tak | H01L 29/0665 |
| 2017/0358457 A1* | 12/2017 | Jang | H01L 29/7853 |
| 2018/0006139 A1 | 1/2018 | Seo | |
| 2018/0108733 A1* | 4/2018 | Augendre | H01L 29/66545 |
| 2018/0138289 A1 | 5/2018 | Rachmady et al. | |
| 2018/0175035 A1* | 6/2018 | Yang | H01L 29/66742 |

FOREIGN PATENT DOCUMENTS

| | | |
|---|---|---|
| KR | 10-2017-0063353 A | 6/2017 |
| TW | 201724278 A | 7/2017 |

OTHER PUBLICATIONS

Notice of Allowance issued in corresponding Korean Patent Application No. 10-2017-0122677, dated Aug. 20, 2019.

Notice of Allowance dated Oct. 9, 2018, issued in parent U.S. Appl. No. 15/653,068.

Non-final Office Action dated Jun. 14, 2018, issued in parent U.S. Appl. No. 15/653,068.

\* cited by examiner

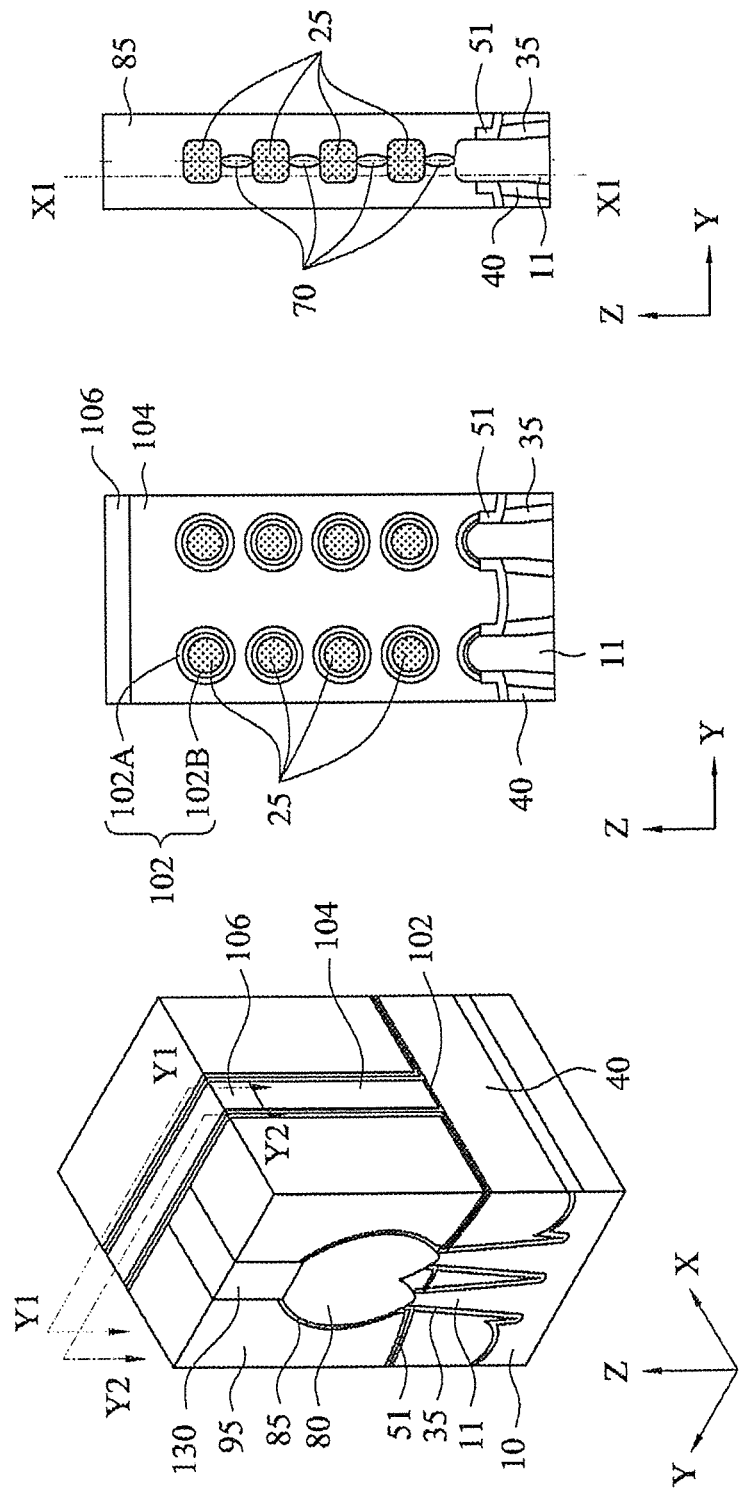

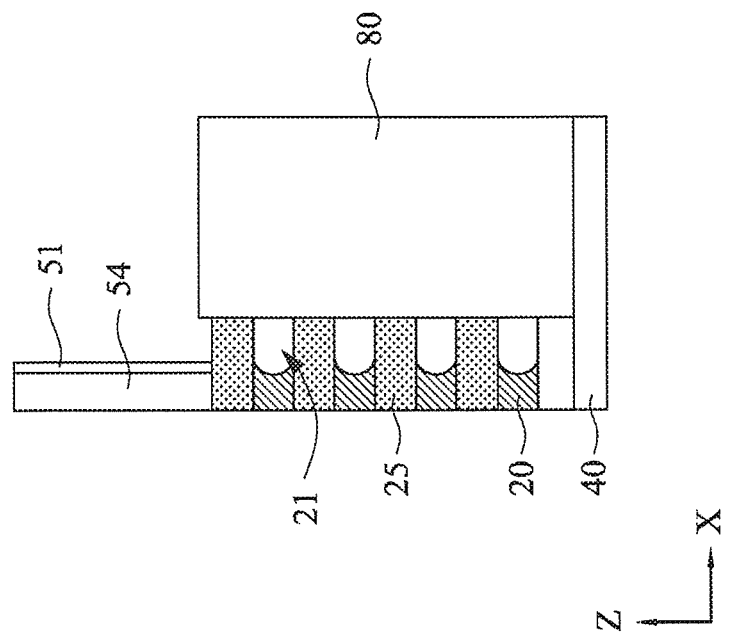
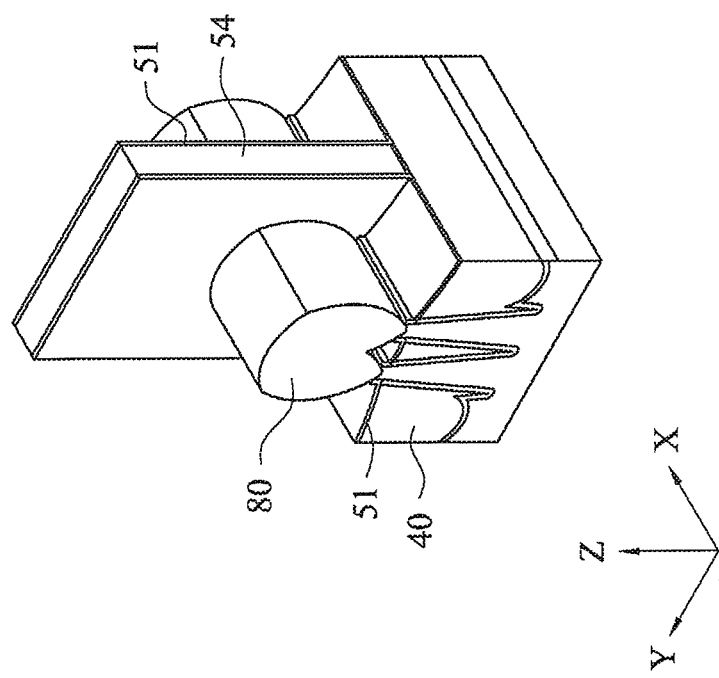
FIG. 11B
FIG. 11A

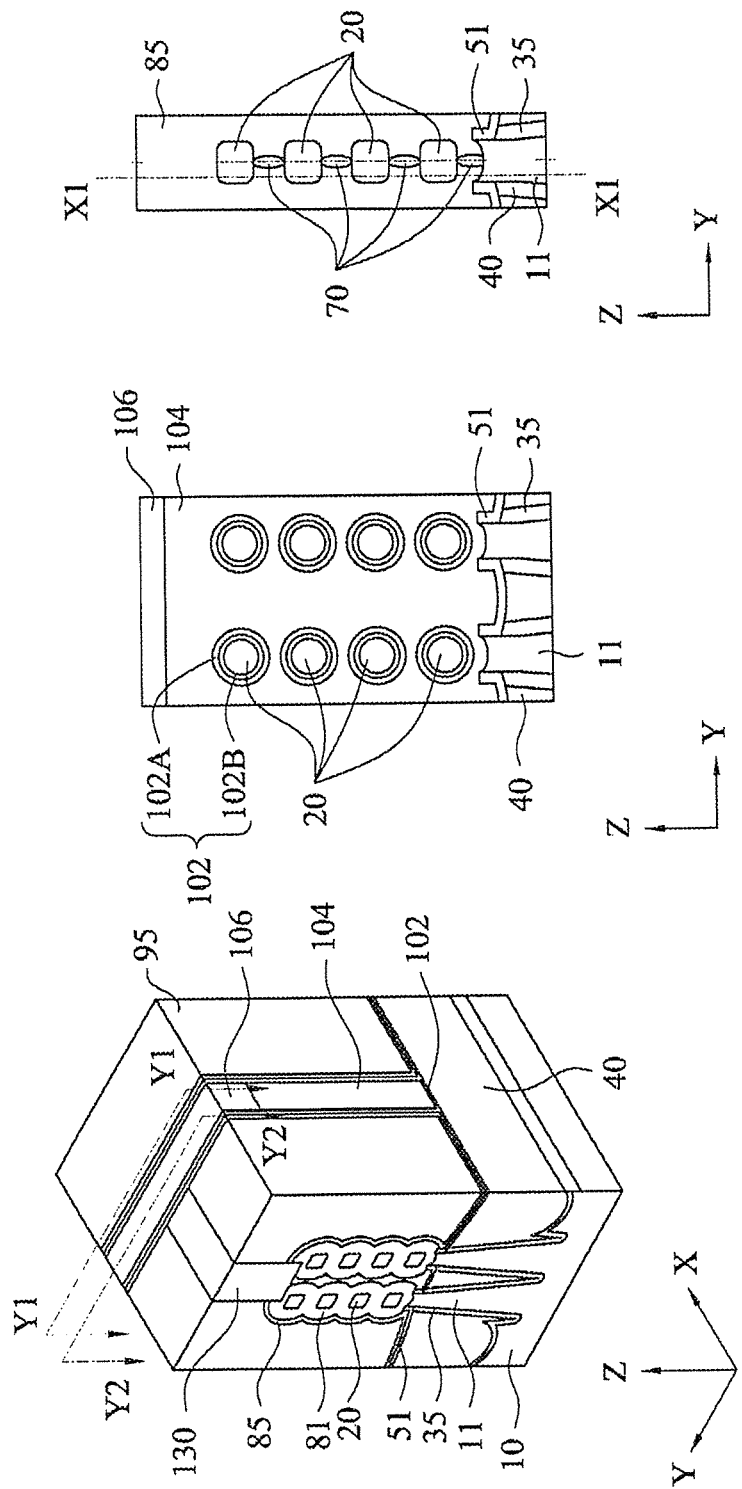

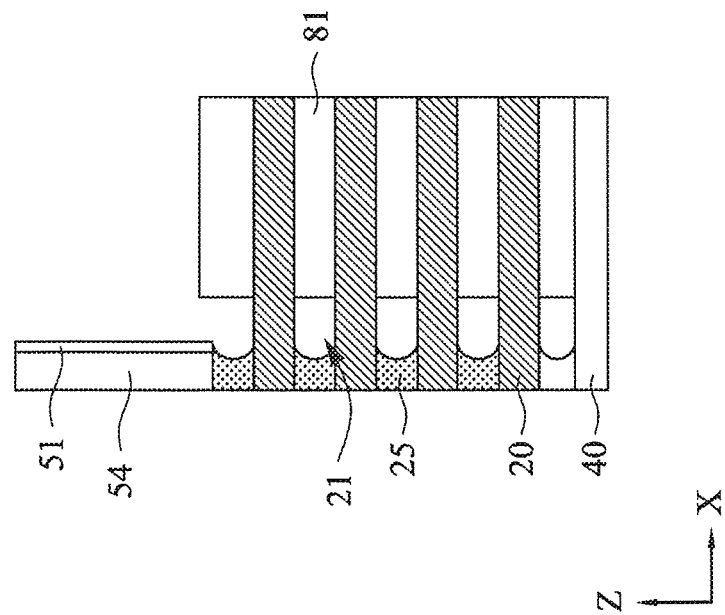
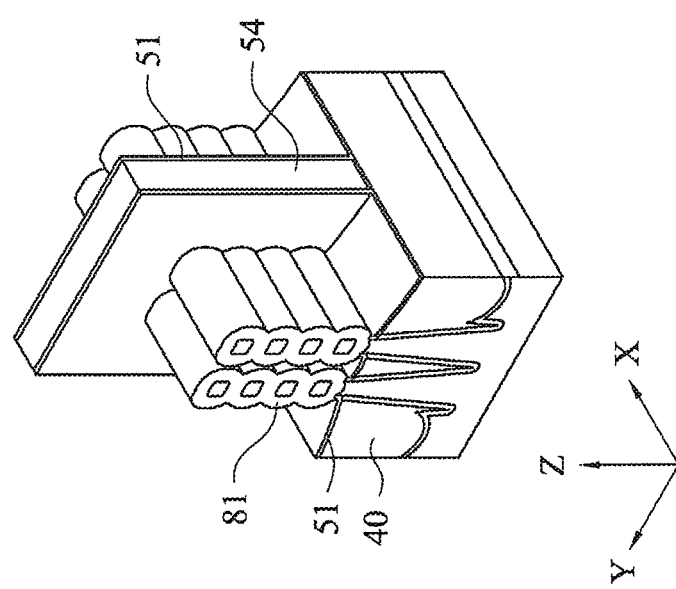
FIG. 27B
FIG. 27A

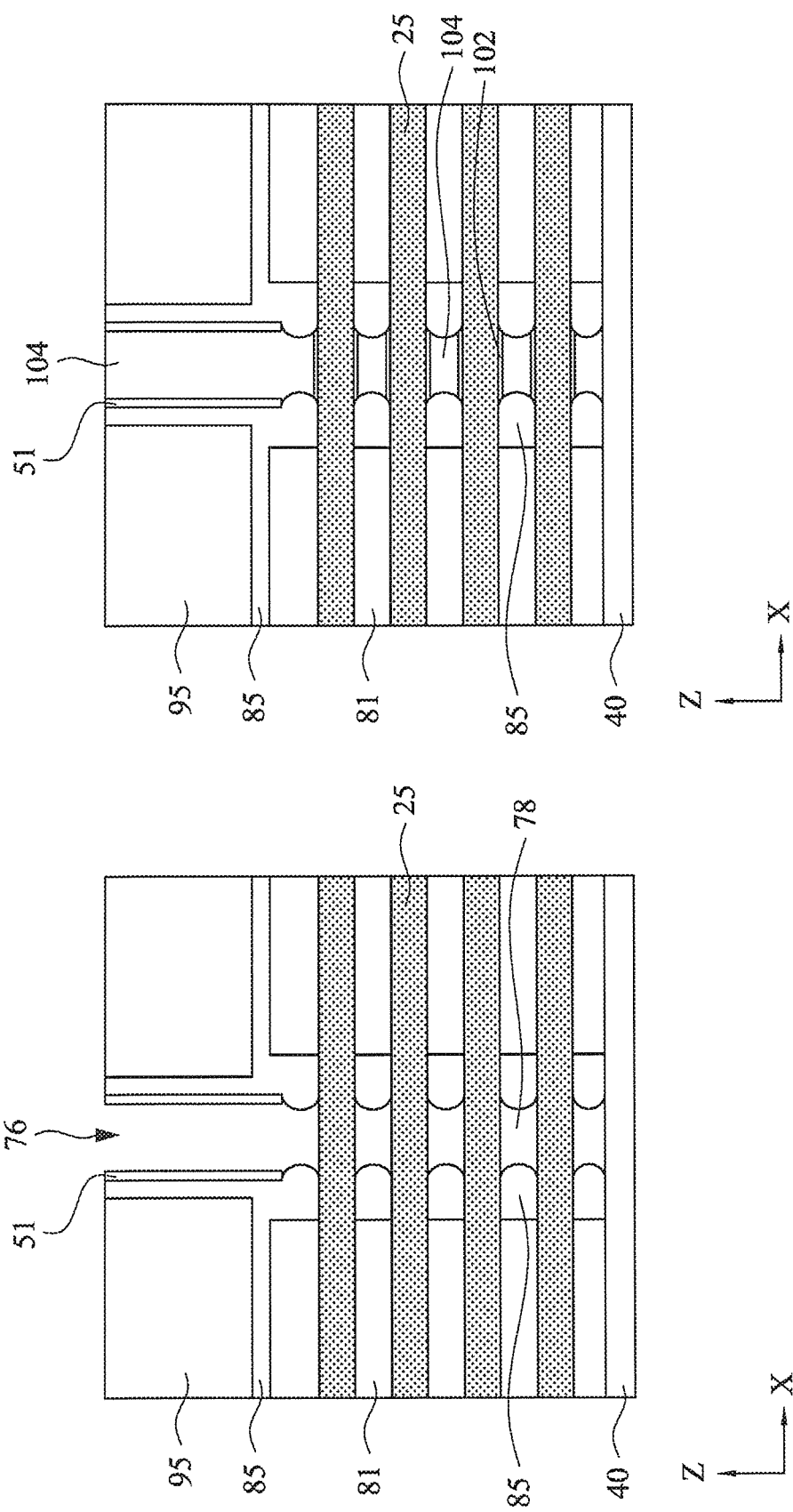

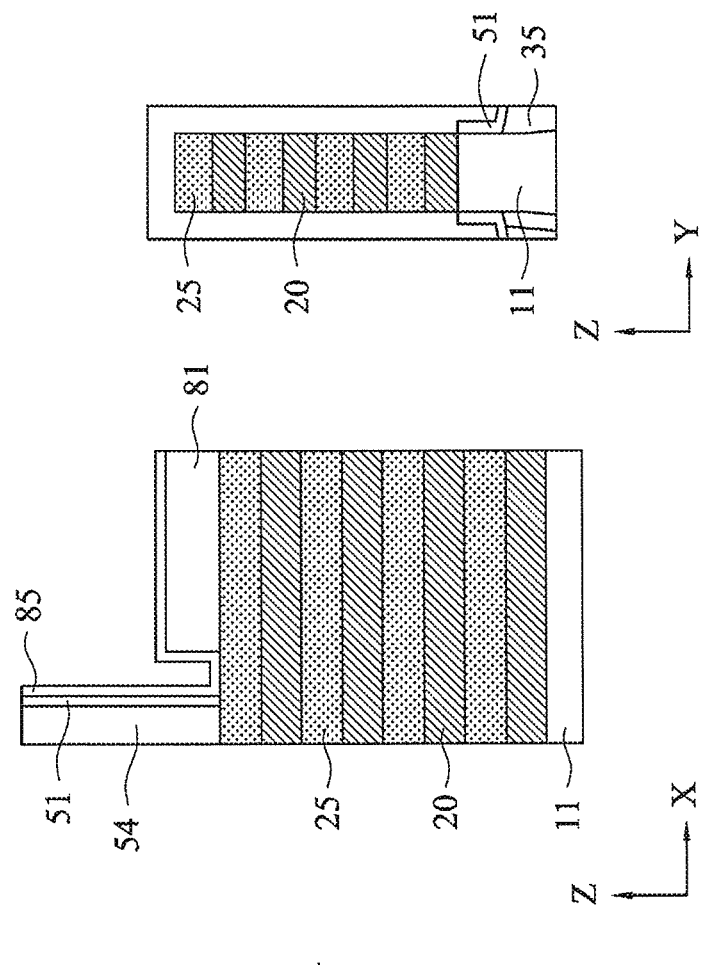
FIG. 38B
FIG. 38C
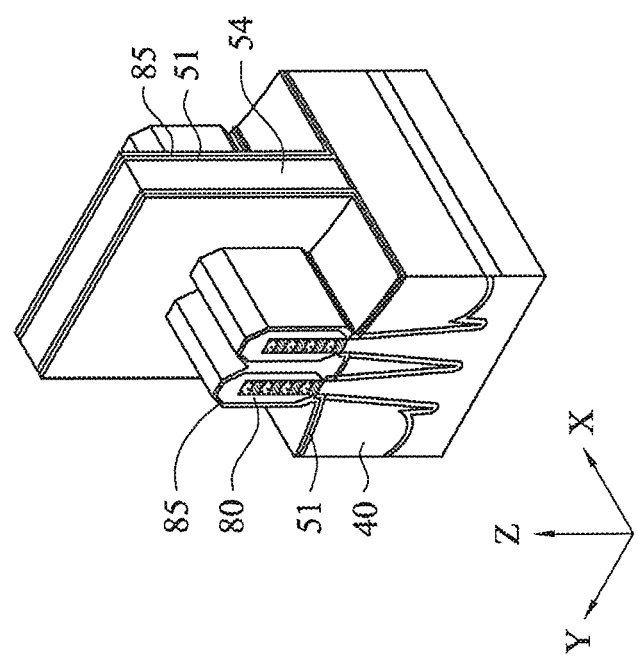
FIG. 38A

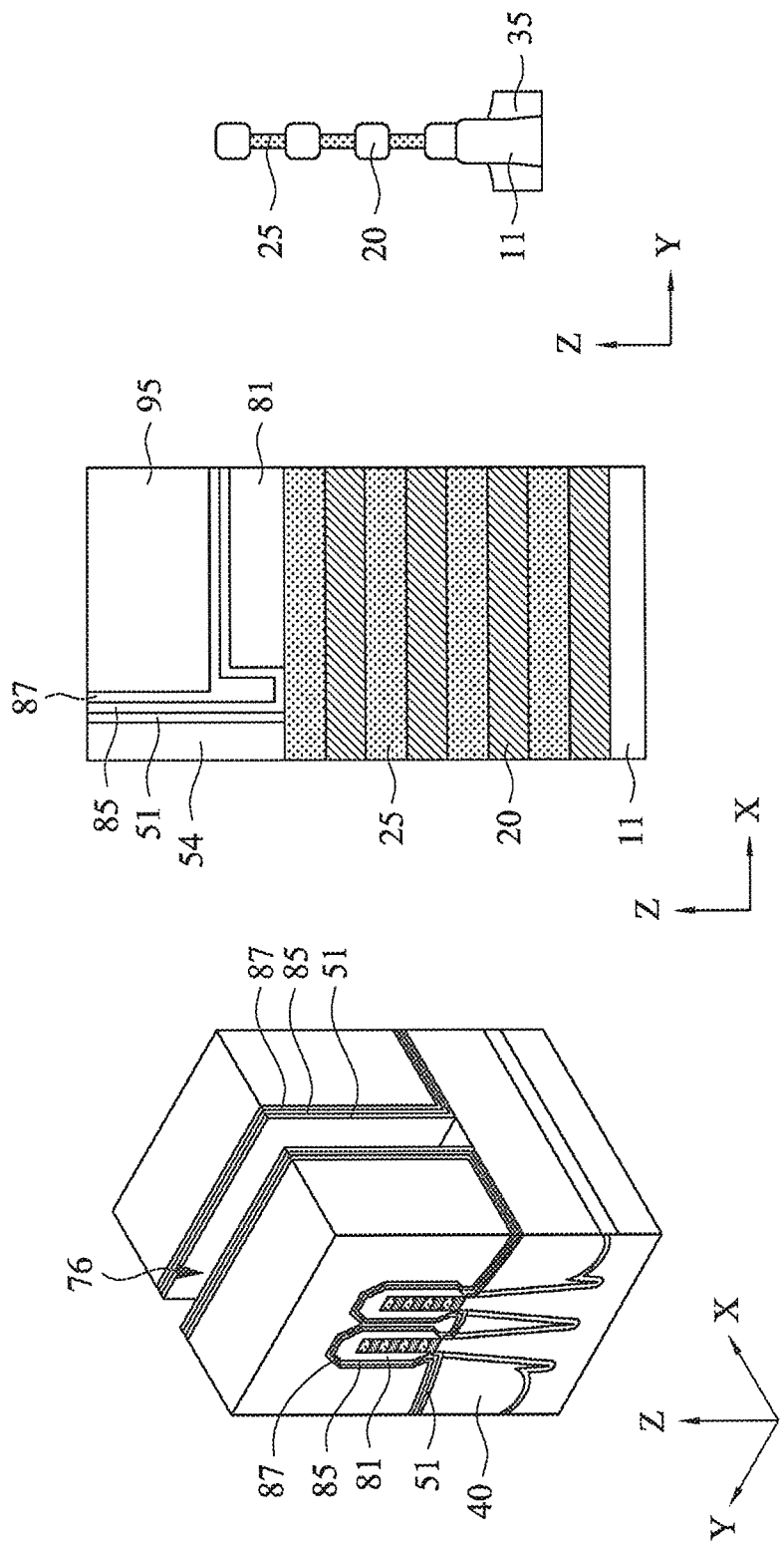

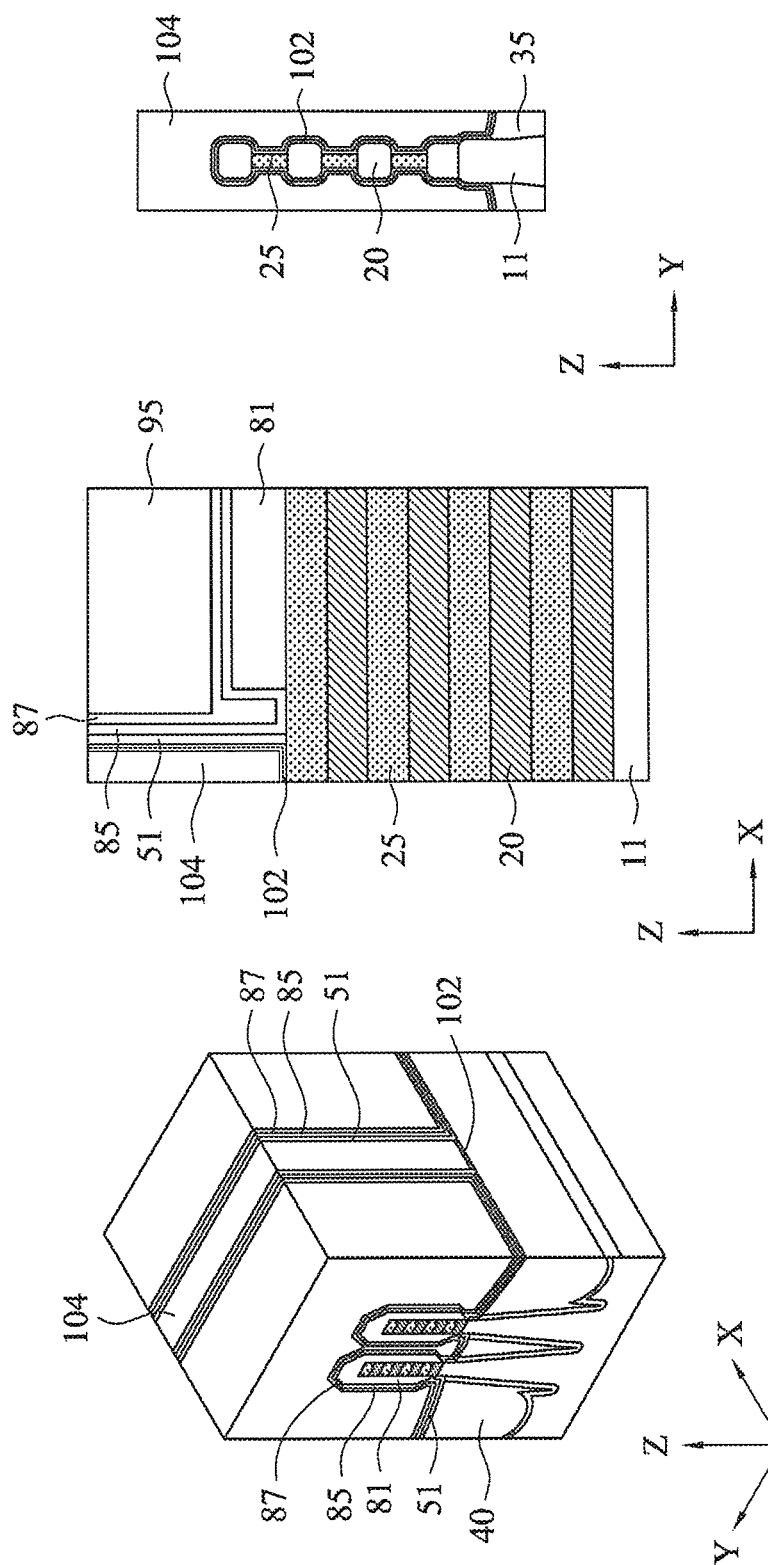

SEMICONDUCTOR DEVICE WITH GATE-ALL-AROUND (GAA) FETS HAVING INNER INSULATING SPACERS

CROSS-REFERENCE TO RELATED APPLICATIONS

This application is a continuation of U.S. patent application Ser. No. 16/206,730, filed on Nov. 30, 2018, now U.S. Pat. No. 10,861,952, which is a divisional patent application of U.S. patent application Ser. No. 15/653,068, filed on Jul. 18, 2017, now U.S. Pat. No. 10,211,307, the entire disclosures of each of which are incorporated herein by reference.

TECHNICAL FIELD

The disclosure relates to method of manufacturing semiconductor integrated circuits, and more particularly to method of manufacturing semiconductor devices including fin field effect transistors (FinFETs) and/or gate-all-around FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1D show various views of a semiconductor FET device according to embodiments of the present disclosure. FIG. 1A is a perspective view, FIG. 1B is a cross sectional view corresponding to Y1-Y1 of FIG. 1A, FIG. 1C is a cross sectional view corresponding to Y2-Y2 of FIG. 1A, FIG. 1D shows a cross sectional view corresponding to X1-X1 of FIG. 1C.

FIG. 10A is a perspective view, FIG. 10B is a cross sectional view along the X direction, FIG. 10C is a cross sectional view along the Y direction, and FIG. 10D shows another perspective view.

FIGS. 11A-11D show one of the various stages of manufacturing a semiconductor FET device according to embodiments of the present disclosure. FIG. 11A is a perspective view, FIG. 11B is a cross sectional view along the X direction, FIG. 11C is a cross sectional view along the Y direction, and FIG. 11D shows another perspective view.

FIG. 12A is a perspective view, FIG. 12B is a cross sectional view along the X direction, and FIG. 12C is a cross sectional view along the Y direction.

FIGS. 17A-17D show various views of a semiconductor FET device according to other embodiments of the present disclosure. FIG. 17A is a perspective view, FIG. 17B is a cross sectional view corresponding to Y1-Y1 of FIG. 17A, FIG. 17C is a cross sectional view corresponding to Y2-Y2 of FIG. 17A, FIG. 17D shows a cross sectional view corresponding to X1-X1 of FIG. 17C.

FIG. 26A is a perspective view, FIG. 26B is a cross sectional view along the X direction, FIG. 26C is a cross sectional view along the Y direction, and FIG. 26D shows another perspective view.

FIGS. 27A-27D show one of the various stages of manufacturing a semiconductor FET device according to embodiments of the present disclosure. FIG. 27A is a perspective view, FIG. 27B is a cross sectional view along the X direction, FIG. 27C is a cross sectional view along the Y direction, and FIG. 27D shows another perspective view.

FIG. 28A is a perspective view, FIG. 28B is a cross sectional view along the X direction, and FIG. 28C is a cross sectional view along the Y direction.

FIG. 31 shows one of the various stages of manufacturing a semiconductor FET device according to other embodiments of the present disclosure.

FIG. 32 shows one of the various stages of manufacturing a semiconductor FET device according to other embodiments of the present disclosure.

FIG. 33A is a perspective view, FIG. 33B is a cross sectional view corresponding to Y1-Y1 of FIG. 33A, FIG. 33C is a cross sectional view corresponding to Y2-Y2 of FIG. 33A, FIG. 33D shows a cross sectional view corresponding to X1-X1 of FIG. 33C.

FIG. 34A is a perspective view, FIG. 34B is a cross sectional view corresponding to Y1-Y1 of FIG. 34A, FIG. 34C is a cross sectional view corresponding to Y2-Y2 of FIG. 34A, and FIG. 34D shows a cross sectional view corresponding to X1-X1 of FIG. 34C.

FIG. 37A is a perspective view, FIG. 37B is a cross sectional view along the X direction, and FIG. 37C is a cross sectional view along the Y direction.

FIGS. 38A-38C show one of the various stages of manufacturing a semiconductor FET device according to embodiments of the present disclosure. FIG. 38A is a perspective view, FIG. 38B is a cross sectional view along the X direction, and FIG. 38C is a cross sectional view along the Y direction.

FIGS. 39A-39C show one of the various stages of manufacturing a semiconductor FET device according to embodiments of the present disclosure. FIG. 39A is a perspective view, FIG. 39B is a cross sectional view along the X direction, and FIG. 39C is a cross sectional view along the Y direction.

FIGS. 40A-40C show one of the various stages of manufacturing a semiconductor FET device according to embodiments of the present disclosure. FIG. 40A is a perspective view, FIG. 40B is a cross sectional view along the X direction, and FIG. 40C is a cross sectional view along the Y direction.

DETAILED DESCRIPTION

Figure 1D:
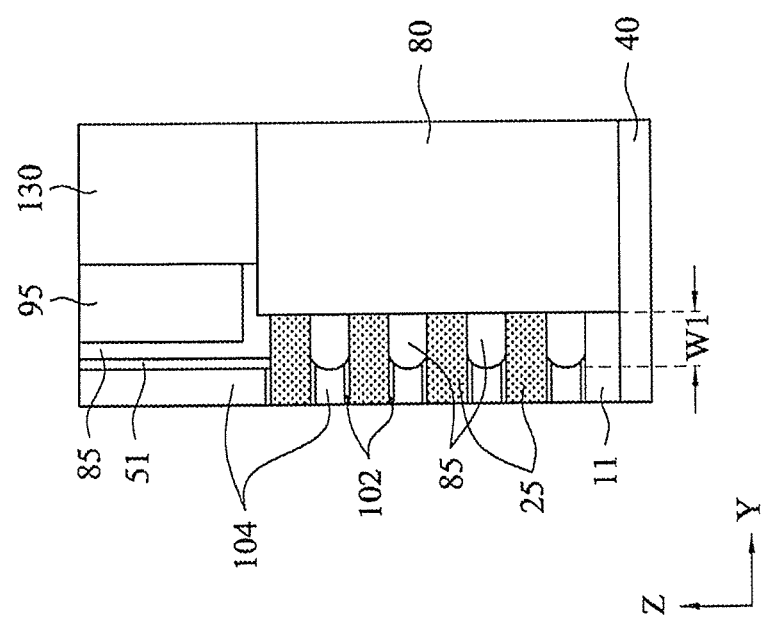

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of."

In the present disclosure, a method for fabricating an inner spacer between a metal gate electrode and a source/drain epitaxial layer for a GAA FET and a stacked channel FET are provided. In this disclosure, a source/drain refers to a source and/or a drain. The inner spacer can be formed by the following process. After a dummy gate structure is formed over a stacked fin structure, in which two different semiconductor wires are alternately stacked, a source/drain region of the stacked fin structure is recessed. Then, an insulating (dielectric) layer is formed in the recess and then the formed insulating layer is etched to form inner spacers on ends of the semiconductor wires. Subsequently a source/ drain epitaxial layer is formed over the inner spacers. It is noted that in the present disclosure, a source and a drain are interchangeably used and the structures thereof are substantially the same.

In the foregoing process, however, it is difficult to precisely control the etching of the insulating layer and thus it is difficult to precisely control the thickness and the location of the inner spacers. In view of this, the present disclosure provides a method for fabricating inner spacers between a metal gate electrode and a source/drain epitaxial layer, which can control the thickness, the shape and/or the location of the inner spacer more precisely.

FIGS. 1A-1D show various views of a semiconductor FET device according to embodiments of the present disclosure. FIG. 1A is a perspective view, FIG. 1B is a cross sectional view corresponding to Y1-Y1 of FIG. 1A, FIG. 1C is a cross sectional view corresponding to Y2-Y2 of FIG. 1A, FIG. 1D shows a cross sectional view corresponding to X1-X1 of FIG. 1C.

As shown in FIGS. 1A-1D, two semiconductor fin structures 11 are provided over a semiconductor substrate 10. In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The bottom part of the fin structures 11 are covered by an insulating layer 35 (a fin liner layer). The fin liner layer 35 includes one or more layers of insulating material.

An isolation insulating layer 40, such as shallow trench isolations (STI), is disposed in the trenches over the substrate 10. The isolation insulating layer 40 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 40 is formed through a process such as CVD, flowable CVD (FCVD), or a spin-on-glass process, although any acceptable process may be utilized.

As shown in FIG. 1B, channel layers 25, which are semiconductor wires, are disposed over the fin structure 11. Each of the channel layers 25 is wrapped around by a gate dielectric layer 102 and a gate electrode layer 104. In some embodiments, the gate dielectric layer 102 includes an interfacial layer 102A and a high-k dielectric layer 102B. Further, a gate cap insulating layer 106 is disposed over the gate electrode layer 104.

As shown in FIGS. 1A, 1C and 1D, a source/drain epitaxial layer 80 is disposed over a source/drain region of the fin structure 11. The source/drain epitaxial layer 80 is covered by an interlayer dielectric (ILD) layer 95. In addition, a first cover layer 51 and/or an insulating layer 85 are formed between the source/drain epitaxial layer 80 and the ILD layer 95 and between the gate electrode 104 and the ILD layer 95. Further, a source/drain contact 130 is disposed in contact with the source/drain epitaxial layer 80. In some embodiment, the source/drain epitaxial layer 80 has a hexagonal shape, a diamond shape, other polygonal shapes or a semi-circular shape in the cross section.

FIG. 1C is a cross sectional view in the Y direction cutting the vertical portion of the insulating layer 85 at an area between the gate electrode 104 and the source/drain epitaxial layer 80. In this area, the semiconductor wires 25 are at least partially covered by the insulating layer 85. In some embodiments, one or more voids 70 are formed in the insulating layer 85 between the semiconductor wires 25. The cross sectional shape of the voids 70 includes a circular shape, an oval shape (vertically and/or horizontally), a teardrop shape or a rectangular or a polygonal shape with rounded corners. In other embodiments, no void is formed.

FIG. 1D shows a cross sectional view corresponding to X1-X1 of FIG. 1C. As shown in FIG. 1D, the insulating layer 85 is disposed between end faces of the gate electrode layer 104 and the source/drain epitaxial layer 80, as inner spacers. In some embodiments, the gate dielectric layer 102 is disposed between the insulating layer 85 and the gate electrode layer 104. As shown in FIG. 1D, end faces of the inner spacers 85 in contact with the source/drain epitaxial layer 80 are vertically aligned (disposed on the same vertical plane). Further, the end faces of the inner spacers 85 in contact with the source/drain epitaxial layer 80 and interfaces between the end faces of the semiconductor wires and the source/drain epitaxial layer 80 are also vertically aligned. The interface between the gate electrode 104 and the inner spacers 85 has a curved surface protruding toward the gate electrode 104, while the interface between the inner spacers 85 and the source/drain epitaxial layer 80 is substantially flat. In some embodiments, the inner spacers 85 are made of a low-k dielectric material, such as SiOC and/or SiOCN or any other suitable dielectric material. The low-k dielectric material has a dielectric constant smaller than silicon dioxide.

The thickness and widths of each of the semiconductor wires 25 is in a range from about 5 nm to about 15 nm in some embodiments, and is in a range from about 6 nm to about 12 nm in other embodiments. The space between adjacent semiconductor wires in the Z direction is in a range from about 2 nm to about 6 nm in some embodiments. The thickness W1 of the inner spacer 85 is in a range from about 2 nm to about 6 nm in some embodiments. The cross sectional shape of the semiconductor wires 25 in the channel region can be any polygonal shape (square, rectangular, triangular, etc.), polygonal shape with rounded corners, circular, or oval (vertically or horizontally).

In FIGS. 1A-1D, two fin structures 11 and four semiconductor wires 25 are illustrated. However, the numbers are not limited thereto. The number of the fin structures can be one, three, four or more per gate, and the number of the semiconductor wires 25 can be one, two, three and more, up to ten.

In certain embodiments, the semiconductor device of FIGS. 1A-1D is an n-type GAA FET. In other embodiments, the semiconductor device of FIGS. 1A-1D is a p-type GAA FET. In some embodiments, one or more n-type GAA FETs and one or more p-type GAA FETs are provided on the same substrate 10.

FIGS. 2-16 show exemplary sequential processes for manufacturing the GAA FET shown in FIGS. 1A-1D according to one embodiment of the present disclosure. It is understood that additional operations can be provided before, during, and after processes shown by FIGS. 2-16, and some of the operations described below can be replaced or eliminated, for additional embodiments of the method. The order of the operations/processes may be interchangeable.

Figure 2:
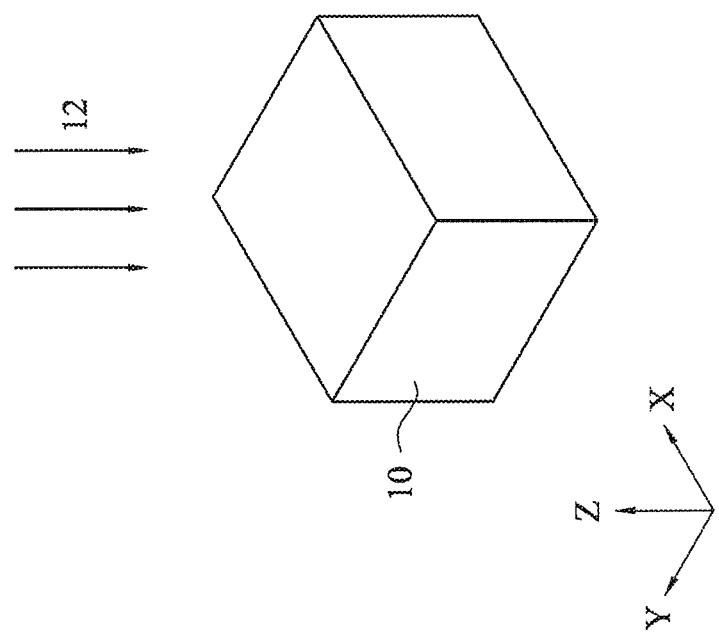
FIG. 2 shows one of the various stages of manufacturing a semiconductor FET device according to embodiments of the present disclosure.

As shown in FIG. 2, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 3:
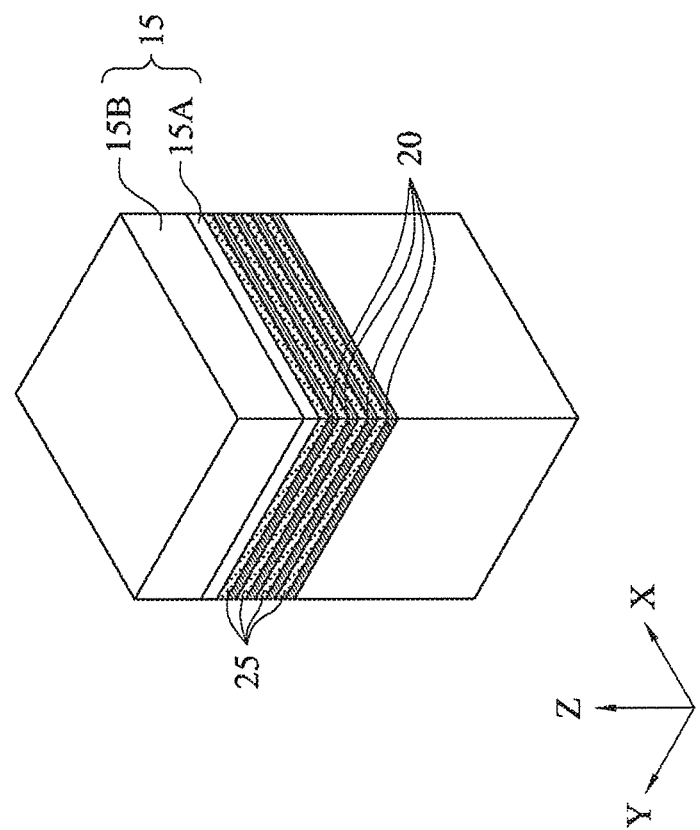
FIG. 3 shows one of the various stages of manufacturing a semiconductor FET device according to embodiments of the present disclosure.

Then, as shown in FIG. 3, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

In FIG. 3, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 4:
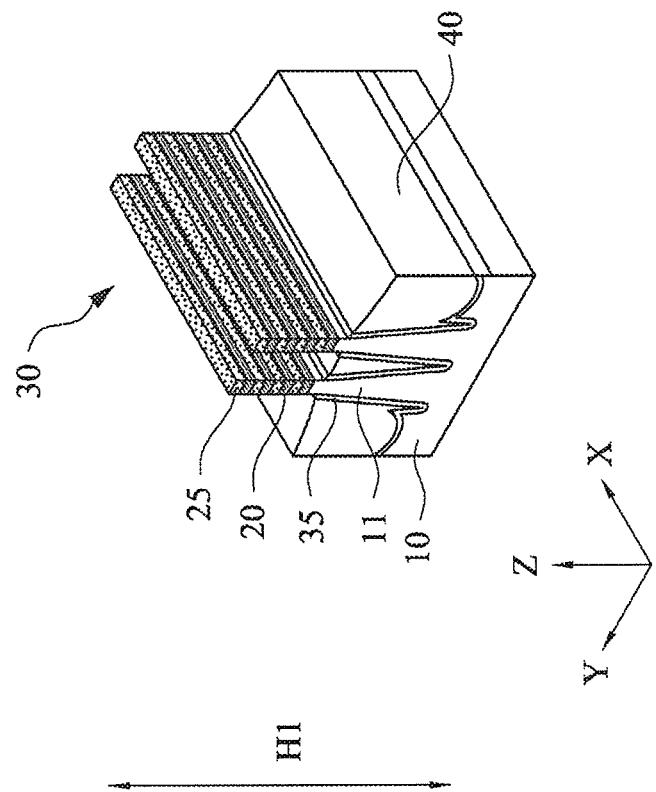
FIG. 4 shows one of the various stages of manufacturing a semiconductor FET device according to embodiments of the present disclosure.

Next, as shown in FIG. 4, the stacked layers of the first and second semiconductor layers 20, 25 are patterned by using the patterned mask layer, thereby the stacked layers are formed into fin structures 30 extending in the X direction. In FIG. 4, two fin structures 30 are arranged in the Y direction. But the number of the fin structures is not limited to two, and may be as small as one and three or more. In some embodiments, one or more dummy fin structures are formed on both sides of the fin structures 30 to improve pattern fidelity in the patterning operations. As shown in FIG. 4, the fin structures 30 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 30 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 30.

After the fin structures 30 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 35 is formed over the fin structures before forming the insulating material layer. The fin liner layer 35 is made of SiN or a silicon nitride-based material (e.g., SiON, SiCN or SiOCN).

In some embodiments, the fin liner layers 35 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 5:
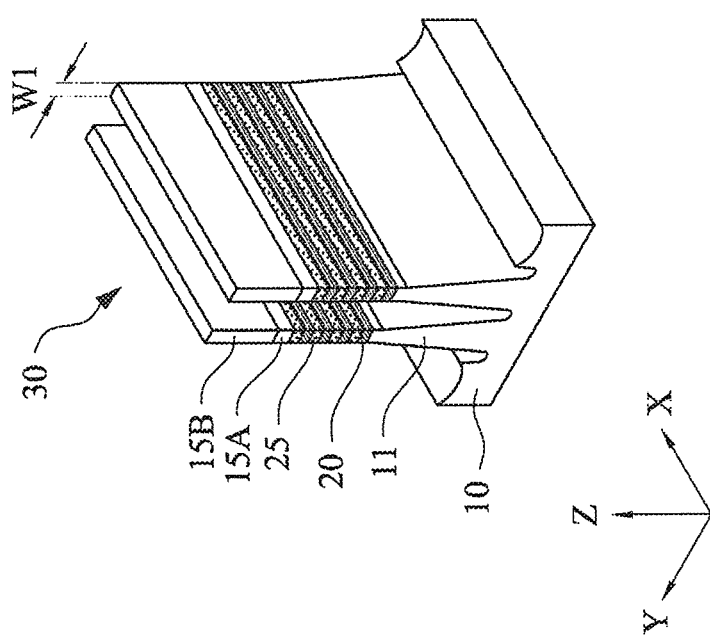
FIG. 5 shows one of the various stages of manufacturing a semiconductor FET device according to embodiments of the present disclosure.

Then, as shown in FIG. 5, the insulating material layer is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 40 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a GAA FET.

Figure 6:
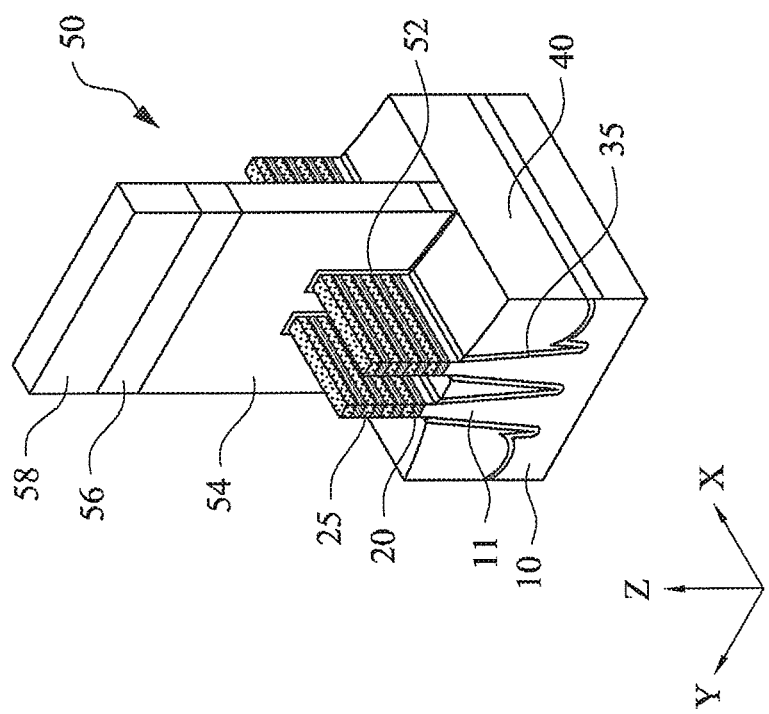
FIG. 6 shows one of the various stages of manufacturing a semiconductor FET device according to embodiments of the present disclosure.

After the isolation insulating layer 40 is formed, a sacrificial (dummy) gate structure 50 is formed, as shown in FIG. 6. FIG. 6 illustrates a structure after a sacrificial gate structure 50 is formed over the exposed fin structures 30. The sacrificial gate structure 50 is formed over a portion of the fin structures which is to be a channel region. The sacrificial gate structure defines the channel region of the GAA FET. The sacrificial gate structure 50 includes a sacrificial gate dielectric layer 52 and a sacrificial gate electrode layer 54. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

The sacrificial gate structure 50 is formed by first blanket depositing the sacrificial gate dielectric layer 52 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 6. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 6. In this disclosure, a source and a drain are interchangeably used and the structures thereof are substantially the same. In FIG. 6, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 7:
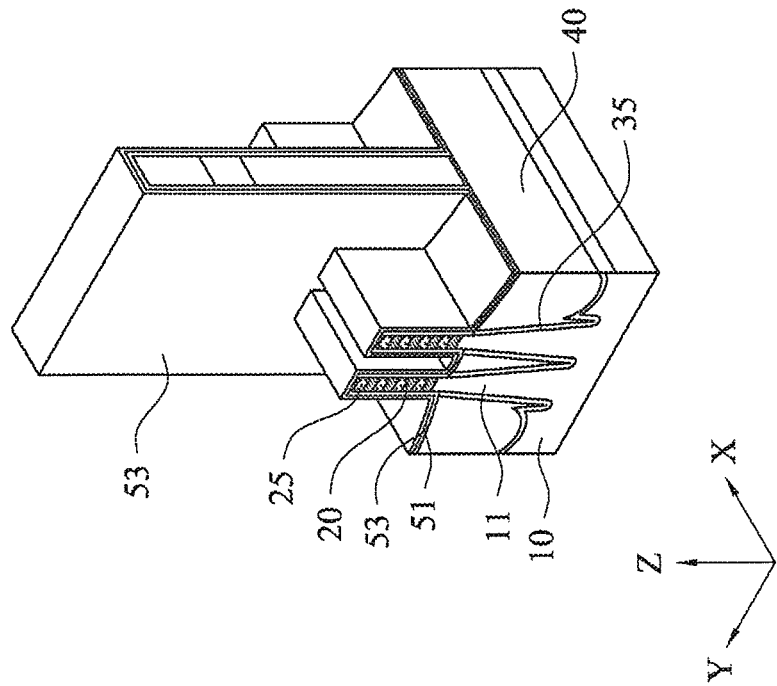
FIG. 7 shows one of the various stages of manufacturing a semiconductor FET device according to embodiments of the present disclosure.

After the sacrificial gate structure is formed, a first cover layer 51 made of an insulating material is conformally formed over the exposed fin structures and the sacrificial gate structure 50. Further, a second cover layer 53 is formed over the first cover layer 51, as shown in FIG. 7. The first and second cover layers are deposited in a conformal manner so that they are formed to have substantially equal thicknesses on vertical surfaces, such as the sidewalls, horizontal surfaces, and the top of the sacrificial gate structure, respectively. In some embodiments, the first cover layer 51 has a thickness in a range from about 2 nm to about 10 nm, and the second cover layer 53 has a thickness greater than the first cover layer and has the thickness in a range from about 5 nm to about 20 nm.

In one embodiment, the first cover layer 51 includes a low-k dielectric material, such as SiOC and/or SiOCN or any other suitable dielectric material. The second cover layer 53 includes one or more of SiN, SiON and SiCN or any other suitable dielectric material. The first cover layer and the second cover layer are made of different materials so that one of them can be selectively etched. The first cover layer 51 and the second cover layer 53 can be formed by ALD or CVD, or any other suitable method.

Figure 8:
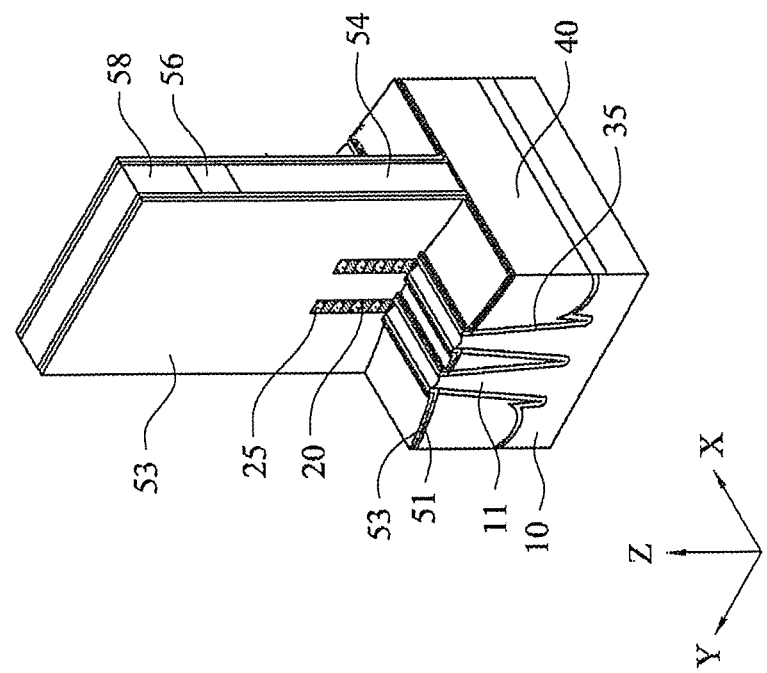
FIG. 8 shows one of the various stages of manufacturing a semiconductor FET device according to embodiments of the present disclosure.

Then, as shown in FIG. 8, the fin structures of the source/drain regions are recessed down to about the upper surface of the isolation insulating layer 40.

Figure 9:
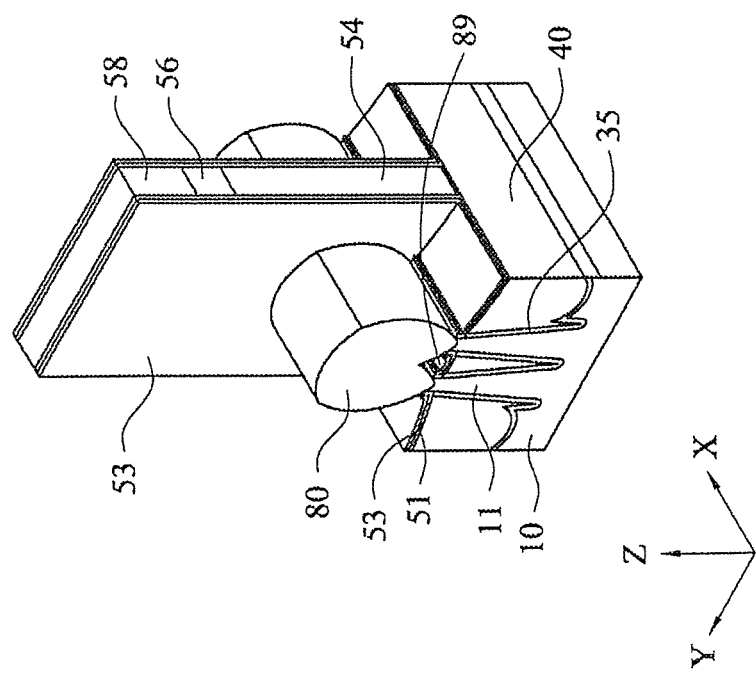
FIG. 9 shows one of the various stages of manufacturing a semiconductor FET device according to embodiments of the present disclosure.

Subsequently, a source/drain epitaxial layer 80 is formed, as shown in FIG. 9. The source/drain epitaxial layer 80 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 80 are formed by an epitaxial growth method using CVD, ALD or molecular beam epitaxy (MBE). As shown in FIG. 9, the source/drain epitaxial layers grow from the recessed two fin structures, and the grown epitaxial layers merge above the isolation insulating layer and form a void 89 in some embodiments. The source/drain epitaxial layer 80 is formed in contact with the second cover layer 53 disposed over side faces of the sacrificial gate structure 50.

Figure 10B:
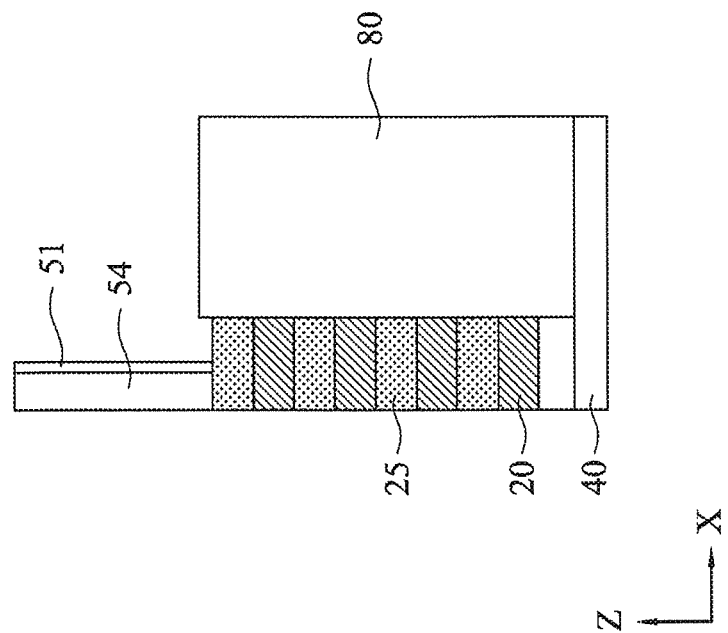
FIGS. 10A-10D show one of the various stages of manufacturing a semiconductor FET device according to embodiments of the present disclosure.
Figure 10A:
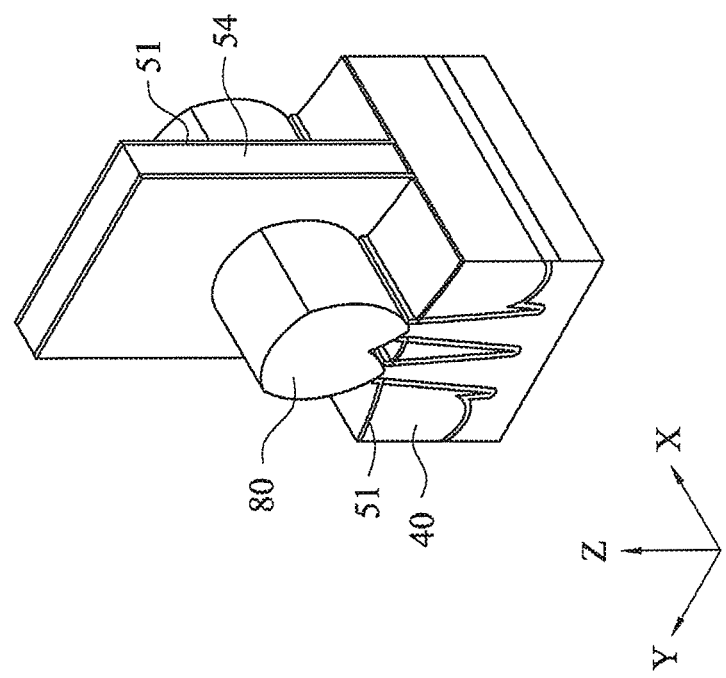
Figure 10C:
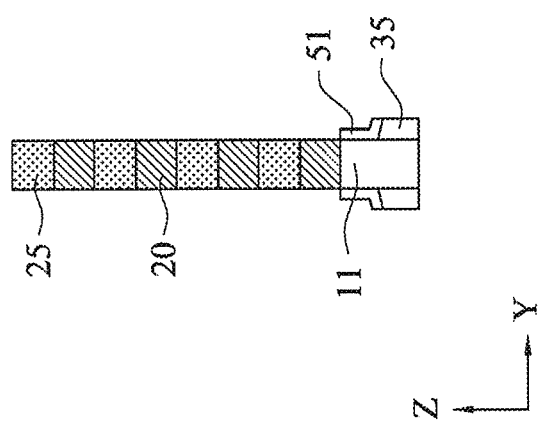
Figure 10D:
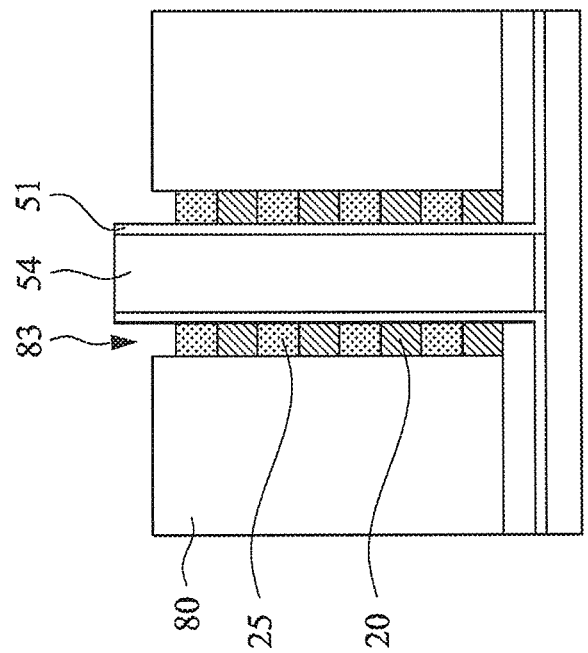

Subsequently, as shown in FIGS. 10A-10D, the second cover layer 53 is removed, by wet and/or dry etching. FIG. 10A is a perspective view, FIG. 10B is a cross sectional view along the X direction cutting one fin structure, FIG. 10C is a cross sectional view along the Y direction cutting a gap 83 of FIG. 10D, and FIG. 10D shows another perspective view.

When the second cover layer 53 is made of SiN, the second cover layer 53 can be selectively removed by using $H_3PO_4$. By removing the second cover layer 53, a gap 83 is formed between the source/drain epitaxial layer 80 and the first cover layer 51 disposed over the side faces of the sacrificial gate structure, as shown in FIG. 10D. As shown in FIG. 10D, a part of the structure is exposed from the gap. The space of the gap 83 is substantially the same as the thickness of the second cover layer 53.

Then, as shown in FIGS. 11A-11D, part of the first semiconductor layers 20 is removed in the gap 83 from the fin structure, and spaces 21 are formed between the second semiconductor layers 25. The first semiconductor layers 20 can be removed or etched using an etchant that can selectively etch the first semiconductor layers 20 against the second semiconductor layers 25.

Figure 11D:
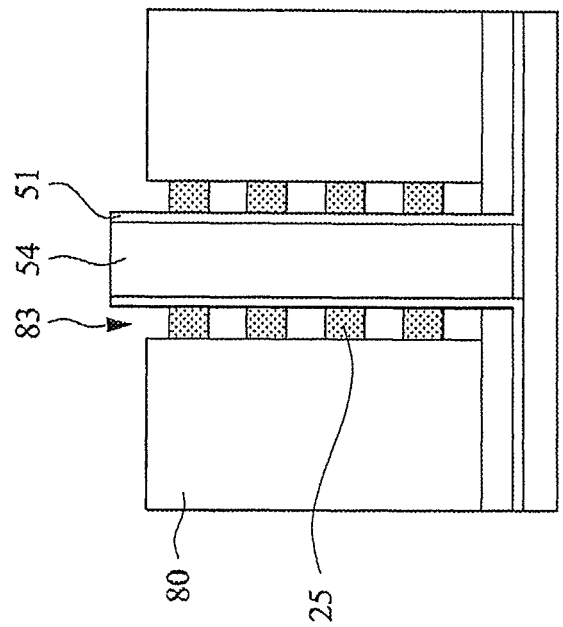
Figure 11C:
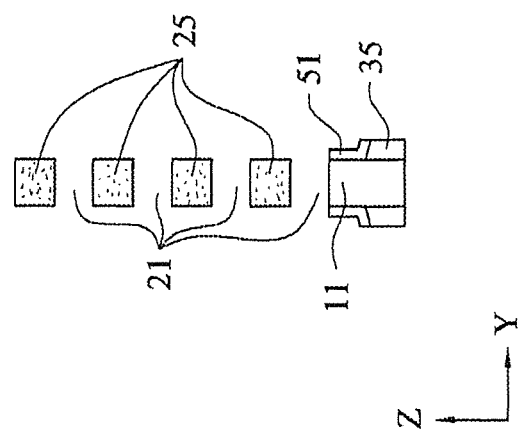

When the first semiconductor layers 20 are Ge or SiGe and the second semiconductor layers 25 are Si, the first semiconductor layers 20 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. Likewise, when the first semiconductor layers 20 are Si and the second semiconductor layers 25 are Ge or SiGe, the first semiconductor layers 20 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. As shown in FIG. 11C, the remaining second semiconductor layers 25 have a rounded corner shape in some embodiments. Due to wet etching properties, the end face of the first semiconductor layers 20 has a convex shape, as shown in FIG. 11B, in some embodiments. By adjusting the etching time, it is possible to control the locations of the end faces of the first semiconductor layers 20.

Figure 12B:
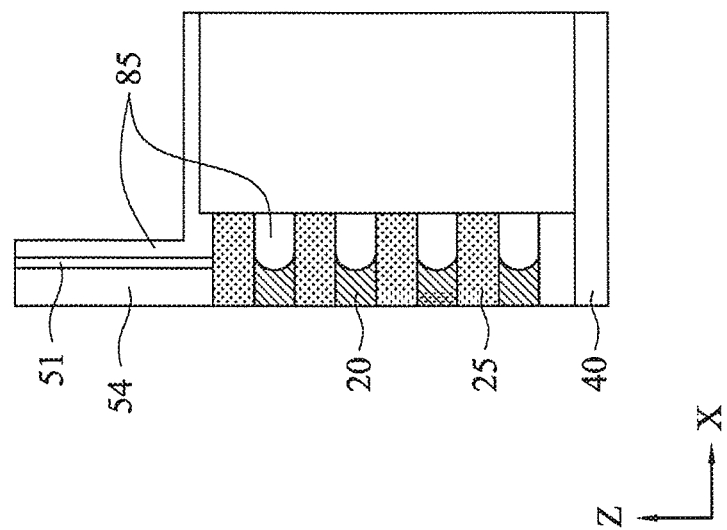
FIGS. 12A-12C show one of the various stages of manufacturing a semiconductor FET device according to embodiments of the present disclosure.
Figure 12A:
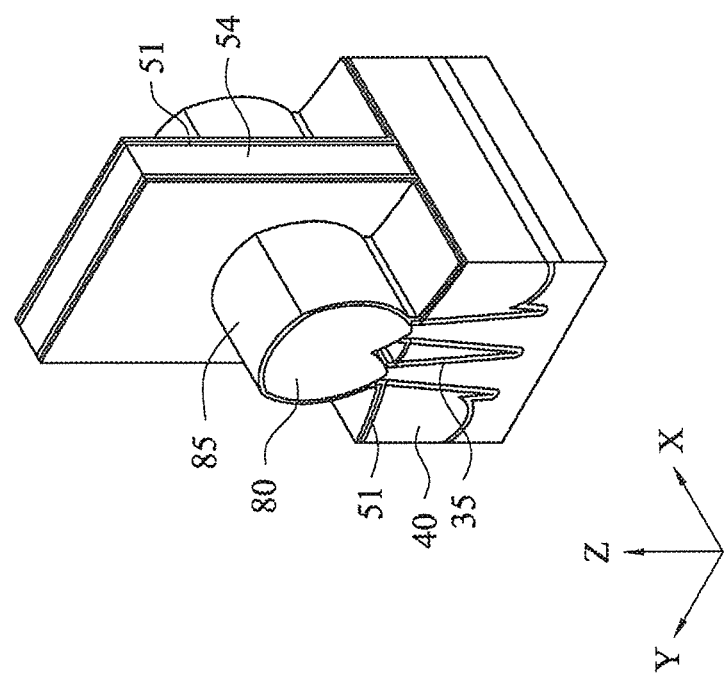
Figure 12C:
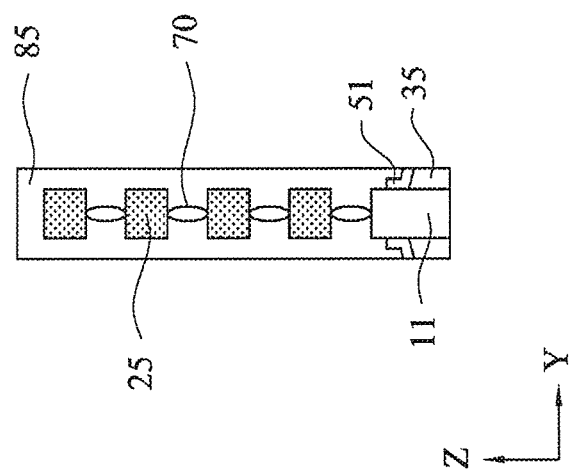

Next, as shown in FIGS. 12A-12C, an insulating layer 85 is formed over the structure shown in FIGS. 11A-11D. The insulating layer 85 can be formed by ALD or CVD or any other suitable method. By depositing the insulating layer 85, the spaces 21 are filled by the insulating material of the insulating layer 85, thereby forming inner spacers 85, as shown in FIG. 12B. In some embodiments, the insulating layer 85 includes a low-k dielectric material, such as SiOC and/or SiOCN or any other suitable dielectric material.

In some embodiments, as shown in FIG. 12C, one or more voids 70 are formed in the inner spacers 85. In certain embodiments, a part of the second semiconductor layer 25 is exposed to the void. In other embodiments, no part of the second semiconductor layer 25 is exposed to the void. In some embodiments, no void is formed.

Figure 13:
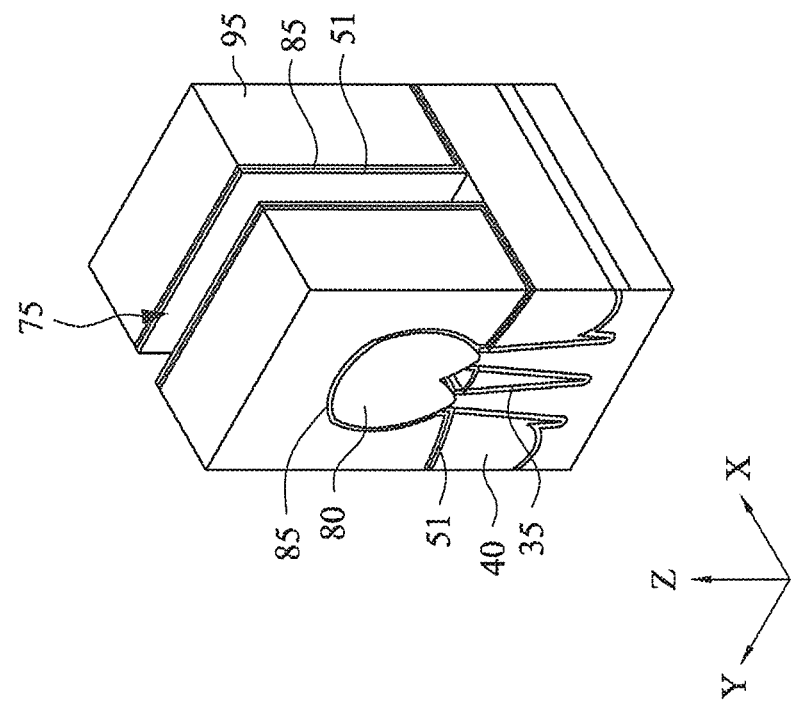
FIG. 13 shows one of the various stages of manufacturing a semiconductor FET device according to embodiments of the present disclosure.
Figure 14:
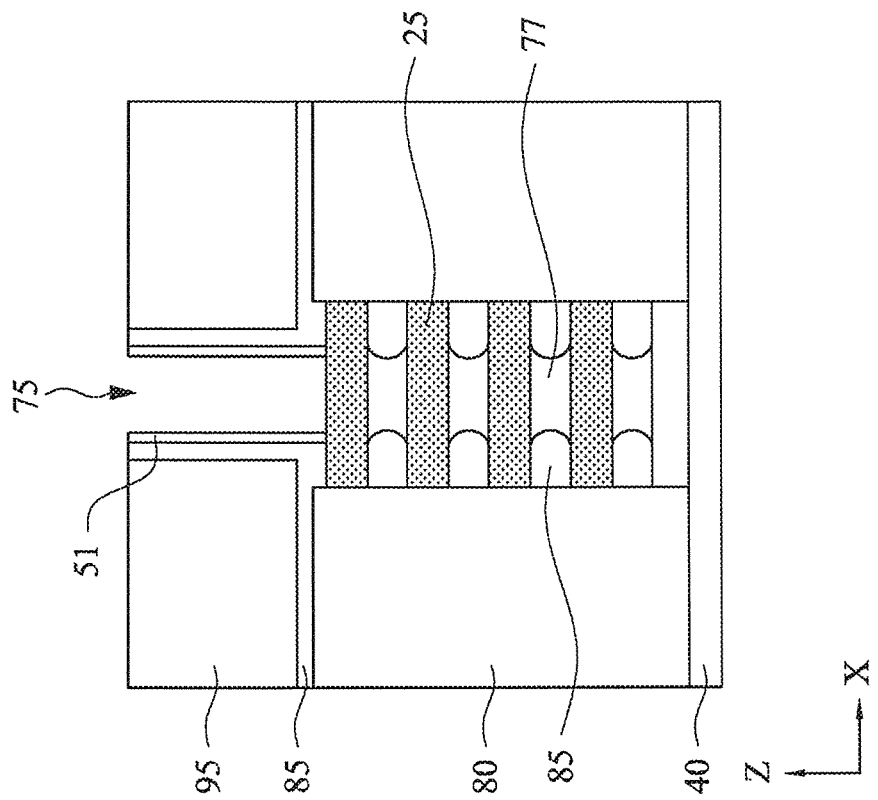
FIG. 14 shows one of the various stages of manufacturing a semiconductor FET device according to embodiments of the present disclosure.

Subsequently, an interlayer dielectric (ILD) layer 95 is formed, as shown in FIG. 13. The materials for the ILD layer 95 include compounds comprising Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer is exposed. Then, the sacrificial gate electrode layer 54 and sacrificial gate dielectric layer 52 are removed, thereby forming a gate space 75, in which the channel regions of the fin structures are exposed, as shown in FIG. 14.

The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 15:
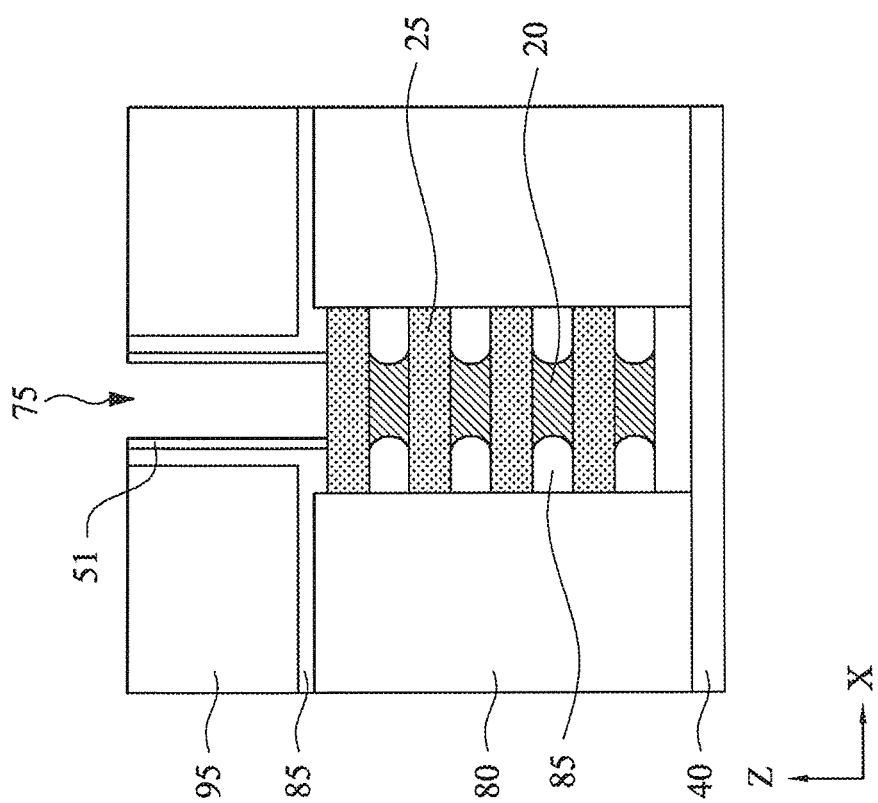
FIG. 15 shows one of the various stages of manufacturing a semiconductor FET device according to embodiments of the present disclosure.

After the sacrificial gate structures are removed, the first semiconductor layers 20 in the fin structures are removed, thereby forming wires of the second semiconductor layers 25, as shown in FIG. 15. The first semiconductor layers 20 can be removed or etched using an etchant that can selectively etch the first semiconductor layers 20 against the second semiconductor layers 25, as set forth above.

Figure 16:
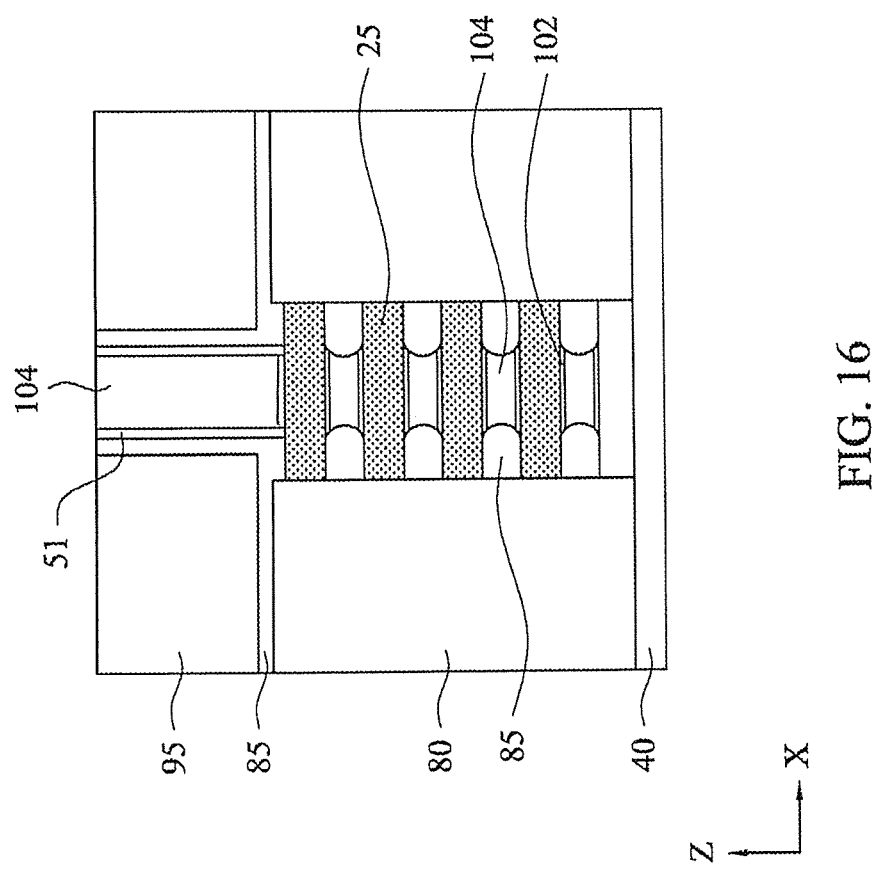
FIG. 16 shows one of the various stages of manufacturing a semiconductor FET device according to embodiments of the present disclosure.

After the semiconductor wires of the second semiconductor layers 25 are formed, a gate dielectric layer 102 is formed around each channel layers (wires of the second semiconductor layers 25), and a gate electrode layer 104 is formed on the gate dielectric layer 102, as shown in FIG. 16.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 102 includes an interfacial layer 102A formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 95. The gate dielectric layer and the gate electrode layer formed over the ILD layer 95 are then planarized by using, for example, CMP, until the top surface of the ILD layer 95 is revealed. After the planarization operation, the gate electrode layer 104 is recessed and a cap insulating layer 106 is formed over the recessed gate electrode 104, as shown in FIG. 1A. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 95 by using dry etching. In some embodiments, the upper portion of the S/D epitaxial layer 80 is etched. In some embodiments, a silicide layer is formed over the S/D epitaxial layer 80. The silicide layer includes one or more of WSi, CoSi, NiSi, TiSi, MoSi and TaSi. Then, a conductive material 130 is formed in the contact holes as shown in FIG. 1A. The conductive material 130 includes one or more of Co, Ni, W, Ti, Ta, Cu, Al, TiN and TaN. It is understood that the GAA FETs undergoes further CMOS processes to form various features such as contacts/vias, interconnect metal layers, dielectric layers, passivation layers, etc.

Figure 17D:
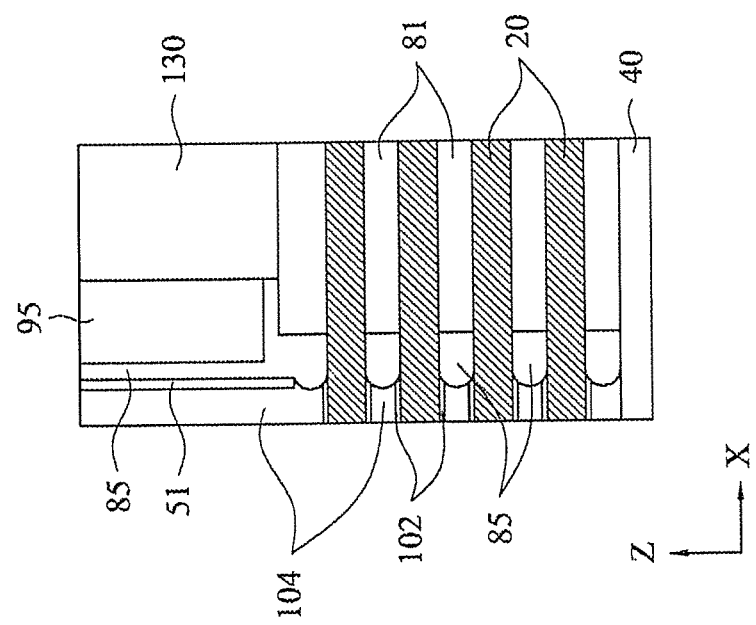

FIGS. 17-17D show various views of a semiconductor FET device according to other embodiments of the present disclosure. FIG. 17A is a perspective view, FIG. 17B is a cross sectional view corresponding to Y1-Y1 of FIG. 17A, FIG. 17C is a cross sectional view corresponding to Y2-Y2 of FIG. 17A, FIG. 17D shows a cross sectional view corresponding to X1-X1 of FIG. 17C. Material, configuration, dimensions and/or processes the same as or similar to the foregoing embodiments described with respect to FIGS. 1A-16 may be employed in the following embodiments, and detailed explanation thereof may be omitted.

In the GAA FET of FIGS. 17A-17D, the semiconductor FET is a p-type GAA FET and the semiconductor wires for the channel region are configured by the first semiconductor layer 20. In some embodiments, the first semiconductor layers 20 are Si1-xGex, where x is more than about 0.3, or Ge (x=1.0) and the second semiconductor layers 25 are Si or Si1-yGey, where y is less than about 0.4, and x>y. Further, the structure of the source/drain region is different from that of the structure shown in FIGS. 1A-1D. In FIGS. 17A-17D, the semiconductor wires of the first semiconductor layer 20 extend into the source/drain region, and are wrapped around by a source/drain epitaxial layer 81.

As shown in FIGS. 17A-17D, two semiconductor fin structures 11 are provided over a semiconductor substrate 10. In certain embodiments, the substrate 10 is made of crystalline Si. The bottom part of the fin structures 11 are covered by an insulating layer 35 (a fin liner layer). The fin liner layer 35 includes one or more layers of insulating material. An isolation insulating layer 40, such as shallow trench isolations (STI), is disposed in the trenches over the substrate 11. The isolation insulating layer 40 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like.

As shown in FIG. 17B, channel layers 20, which are semiconductor wires, are disposed over the fin structure 11. Each of the channel layers 20 is wrapped around by a gate dielectric layer 102 and a gate electrode layer 104. In some embodiments, the gate dielectric layer 102 includes an interfacial layer 102A and a high-k dielectric layer 102B. Further, a gate cap insulating layer 106 is disposed over the gate electrode layer 104.

As shown in FIGS. 17A, 17C and 17D, a source/drain epitaxial layer 81 is disposed over a source/drain region of the fin structure 11. The source/drain epitaxial layer 81 is covered by an interlayer dielectric (ILD) layer 95. In addition, a first cover layer 51 and/or an insulating layer 85 are formed between the source/drain epitaxial layer 81 and the ILD layer 95 and between the gate electrode 104 and the ILD layer 95. Further, a source/drain contact 130 is disposed in contact with the source/drain epitaxial layer 81.

FIG. 17C is a cross sectional view in the Y direction cutting the vertical portion of the insulating layer 85 at an area between the gate electrode 104 and the source/drain epitaxial layer 80. In this area, the semiconductor wires 20 are at least partially covered by the insulating layer 85. In some embodiments, one or more voids 70 are formed in the insulating layer 85 between the semiconductor wires 20. In other embodiments, no void is formed.

FIG. 17D shows a cross sectional view corresponding to X1-X1 of FIG. 17C and FIG. 17E shows a cross sectional view corresponding to X2-X2 of FIG. 17C. As shown in FIG. 17D, the insulating layer 85 is disposed between end faces of the gate electrode layer 104 and the source/drain epitaxial layer 81, as inner spacers. In some embodiments, the gate dielectric layer 102 is disposed between the insulating layer 85 and the gate electrode layer 104. As shown in FIG. 17D, end faces of the inner spacers 85 in contact with the source/drain epitaxial layer 81 are vertically aligned (disposed on the same vertical plane).

The interface between the gate electrode 104 and the inner spacers 85 has a curved surface protruding toward the gate electrode 104, while the interface between the inner spacers 85 and the source/drain epitaxial layer 81 is substantially flat. In some embodiments, the inner spacers 85 are made of a low-k dielectric material, such as SiOC and/or SiOCN or any other suitable dielectric material.

The thickness and widths of each of the semiconductor wires 20 is in a range from about 5 nm to about 15 nm in some embodiments, and is in a range from about 6 nm to about 12 nm in other embodiments. The space between adjacent semiconductor wires in the Z direction is in a range from about 2 nm to about 6 nm in some embodiments. The thickness W1 of the inner spacer 85 is in a range from about 2 nm to about 6 nm in some embodiments. The cross sectional shape of the semiconductor wires 20 in the channel region can be any polygonal shape (square, rectangular, triangular, etc.), polygonal shape with rounded corners, circular, or oval (vertically or horizontally).

In FIGS. 17A-17D, two fin structures 11 and four semiconductor wires 20 are illustrated. However, the numbers are not limited thereto. The number of the fin structures can be one, three, four or more per gate electrode, and the number of the semiconductor wires 20 can be one, two, three and more, up to ten.

In certain embodiments, one or more semiconductor devices of FIGS. 1A-1D (an n-type and/or a p-type GAA FET) and one or more p-type GAA FETs of FIGS. 17A-17D are provided on the same substrate 10.

FIGS. 18-32 show exemplary sequential processes for manufacturing the GAA FET shown in FIGS. 17A-17D according to one embodiment of the present disclosure. It is understood that additional operations can be provided before, during, and after processes shown by FIGS. 18-32, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-16 may be employed in the following embodiments, and detailed explanation thereof may be omitted. The GAA FET of FIGS. 1A-1D can be manufactured together with the GAA FET shown in FIGS. 17A-17D.

Figure 18:
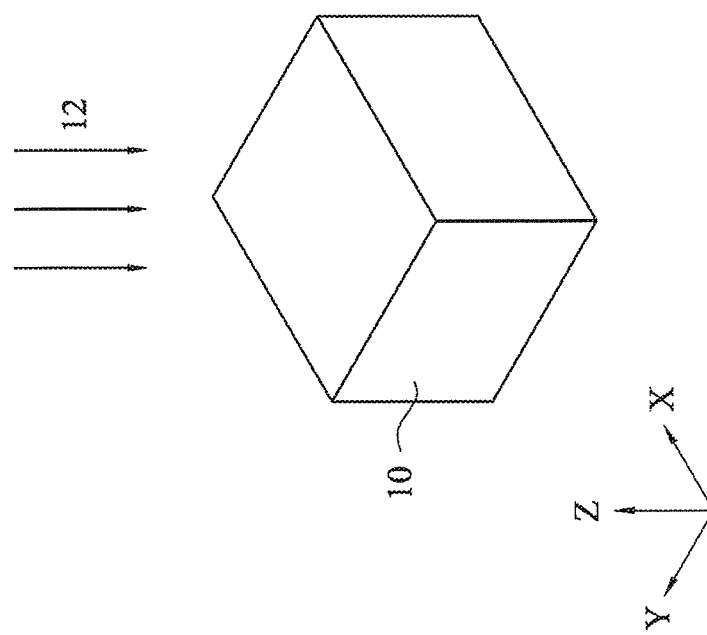
FIG. 18 shows one of the various stages of manufacturing a semiconductor FET device according to other embodiments of the present disclosure.

As shown in FIG. 18, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example, phosphorus for a p-type Fin FET.

Figure 19:
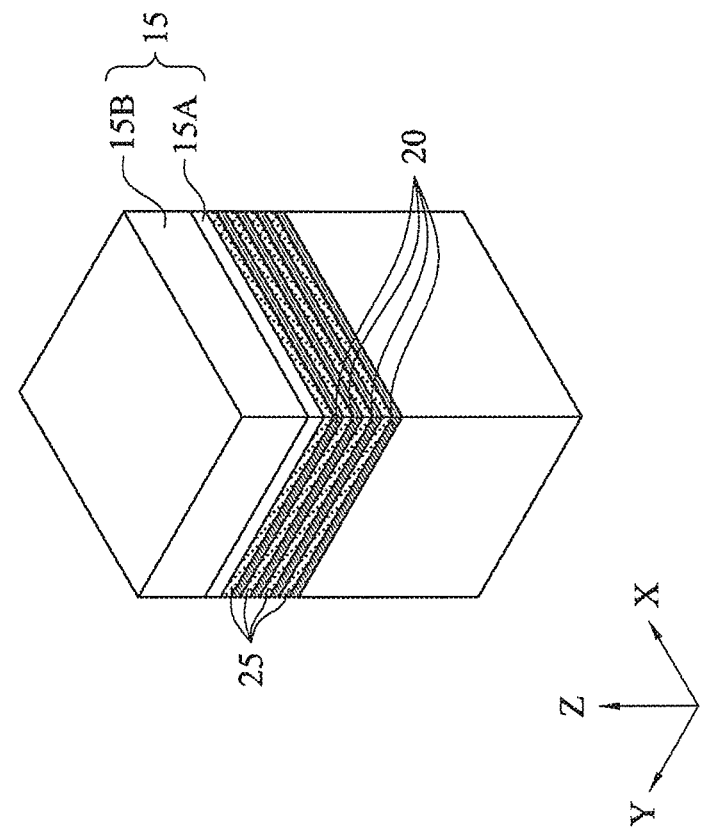
FIG. 19 shows one of the various stages of manufacturing a semiconductor FET device according to other embodiments of the present disclosure.

Then, as shown in FIG. 19, stacked semiconductor layers are formed over the substrate 10. The stacked semiconductor layers include first semiconductor layers 20 and second semiconductor layers 25. Further, a mask layer 15 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y.

Figure 20:
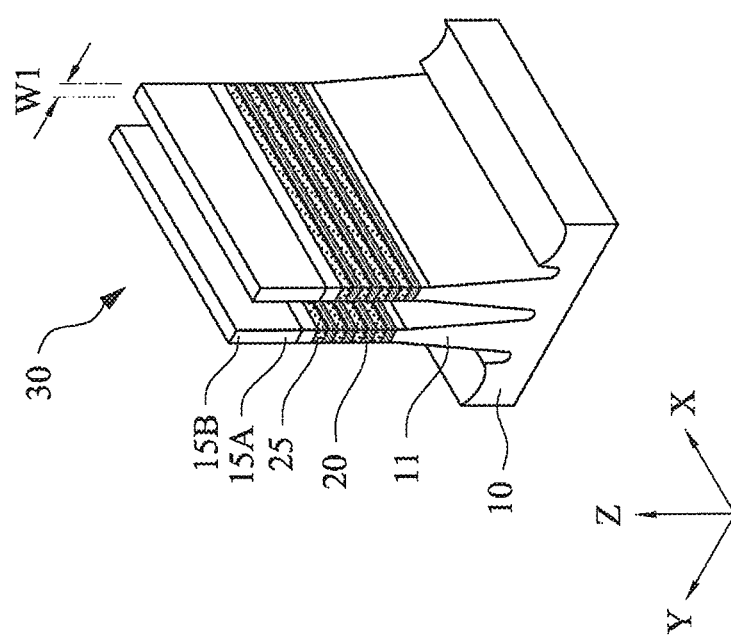
FIG. 20 shows one of the various stages of manufacturing a semiconductor FET device according to other embodiments of the present disclosure.

In FIG. 20, four layers of the first semiconductor layer 20 and four layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer 20 (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN). The mask layer 15 is patterned into a mask pattern by using patterning operations including photo-lithography and etching.

Next, as shown in FIG. 20, the stacked layers of the first and second semiconductor layers 20, 25 are patterned by using the patterned mask layer, thereby the stacked layers are formed into fin structures 30 extending in the X direction. In FIG. 20, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations. As shown in FIG. 20, the fin structures 30 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 30 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 30.

After the fin structures 30 are formed, an insulating material layer including one or more layers of insulating material is formed over the substrate so that the fin structures are fully embedded in the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 35 is formed over the fin structures before forming the insulating material layer. The fin liner layer 35 is made of SiN or a silicon nitride-based material (e.g., SiON, SiCN or SiOCN).

Figure 21:
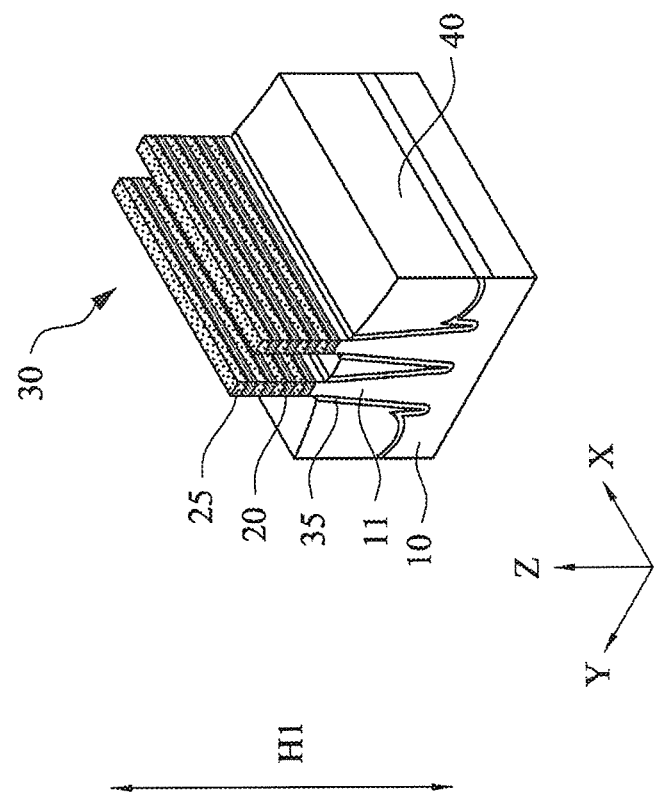
FIG. 21 shows one of the various stages of manufacturing a semiconductor FET device according to other embodiments of the present disclosure.

Then, as shown in FIG. 21, the insulating material layer is recessed to form an isolation insulating layer 40 so that the upper portions of the fin structures 30 are exposed. With this operation, the fin structures 30 are electrically separated from each other by the isolation insulating layer 40 (STI).

In the embodiment shown in FIG. 21, the insulating material layer 40 is recessed until the upper portion of the fin structure (well layer) 11 is exposed. In other embodiments, the upper portion of the fin structure 11 is not exposed. The second semiconductor layers 25 are sacrificial layers which are subsequently partially removed, and the first semiconductor layers 20 are subsequently formed into semiconductor wires as channel layers of a GAA FET.

Figure 22:
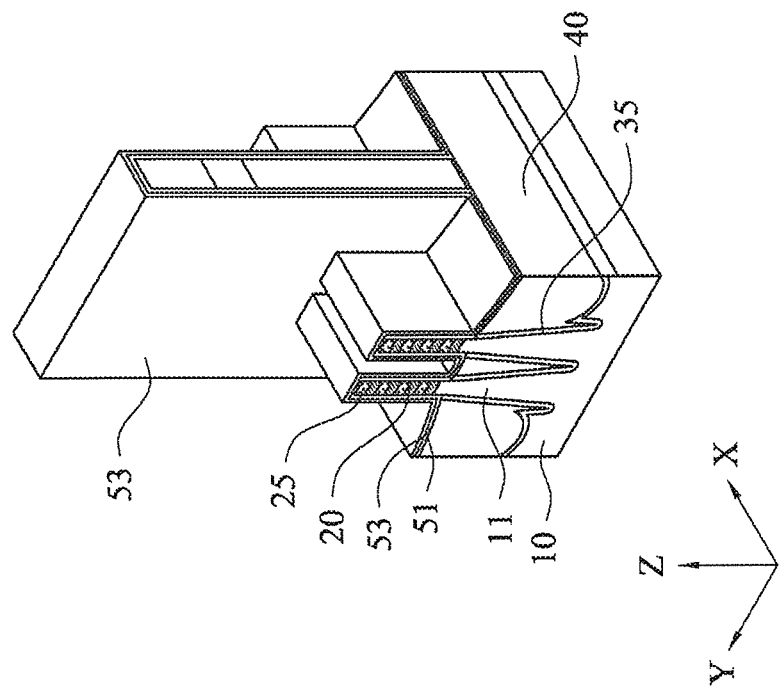
FIG. 22 shows one of the various stages of manufacturing a semiconductor FET device according to other embodiments of the present disclosure.

After the isolation insulating layer 40 is formed, a sacrificial (dummy) gate structure 50 is formed, as shown in FIG. 22. FIG. 22 illustrates a structure after a sacrificial gate structure 50 is formed over the exposed fin structures 30. The sacrificial gate structure 50 is formed over a portion of the fin structures which is to be a channel region. The sacrificial gate structure defines the channel region of the GAA FET. The sacrificial gate structure 50 includes a sacrificial gate dielectric layer 52 and a sacrificial gate electrode layer 54. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

The sacrificial gate structure 50 is formed by first blanket depositing the sacrificial gate dielectric layer 52 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer 54. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 22. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 22. In this disclosure, a source and a drain are interchangeably used and the structures thereof are substantially the same. In FIG. 22, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 23:
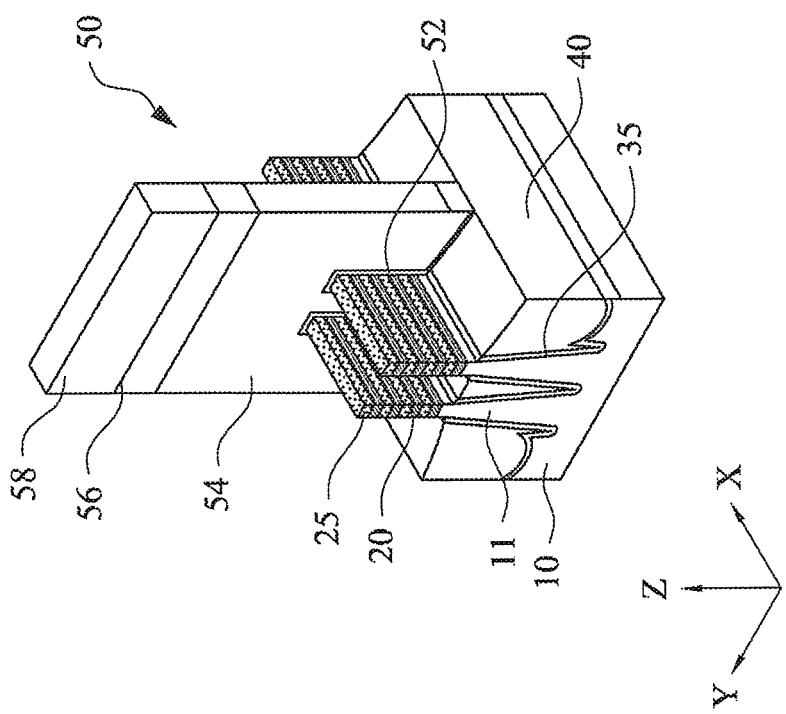
FIG. 23 shows one of the various stages of manufacturing a semiconductor FET device according to other embodiments of the present disclosure.

After the sacrificial gate structure is formed, a first cover layer 51 made of an insulating material is conformally formed over the exposed fin structures 11 and the sacrificial gate structure 50. Further, a second cover layer 53 is formed over the first cover layer 51, as shown in FIG. 23. The first and second cover layers are deposited in a conformal manner so that they are formed to have substantially equal thicknesses on vertical surfaces, such as the sidewalls, horizontal surfaces, and the top of the sacrificial gate structure, respectively. In some embodiments, the first cover layer 51 has a thickness in a range from about 2 nm to about 10 nm, and the second cover layer 53 has a thickness greater than the first cover layer and has a thickness in a range from about 5 nm to about 20 nm.

In one embodiment, the first cover layer 51 includes a low-k dielectric material, such as SiOC and/or SiOCN or any other suitable dielectric material. The second cover layer 53 includes one or more of SiN, SiON and SiCN or any other suitable dielectric material. The first cover layer and the second cover layer are made of different materials so that one of them can be selectively etched. The first cover layer 51 and the second cover layer 53 can be formed by ALD or CVD, or any other suitable method.

Figure 24:
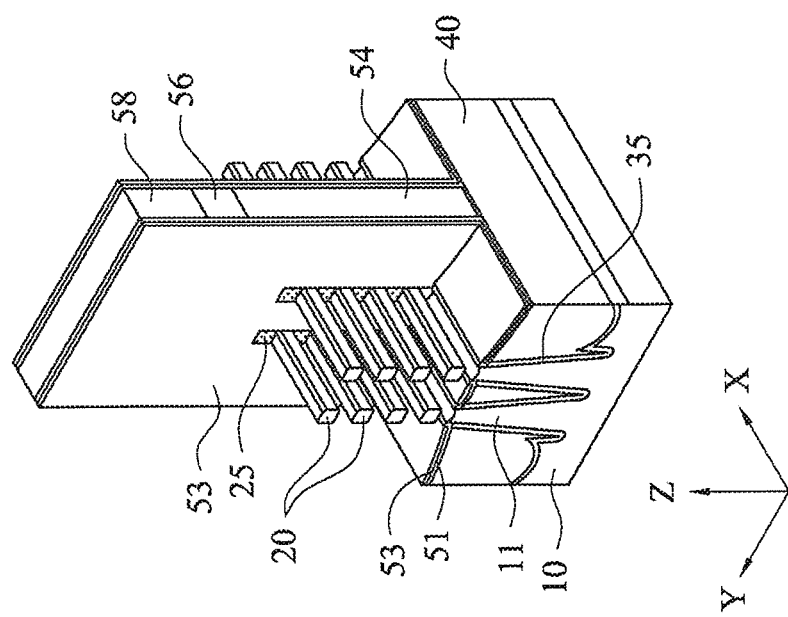
FIG. 24 shows one of the various stages of manufacturing a semiconductor FET device according to other embodiments of the present disclosure.

Then, as shown in FIG. 24, the second semiconductor layers 25 of the fin structures of the source/drain regions are removed, thereby leaving the first semiconductor layer 20 as semiconductor wires. When the second semiconductor layers 25 are Ge or SiGe and the first semiconductor layers 20 are Si, the second semiconductor layers 25 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Figure 25:
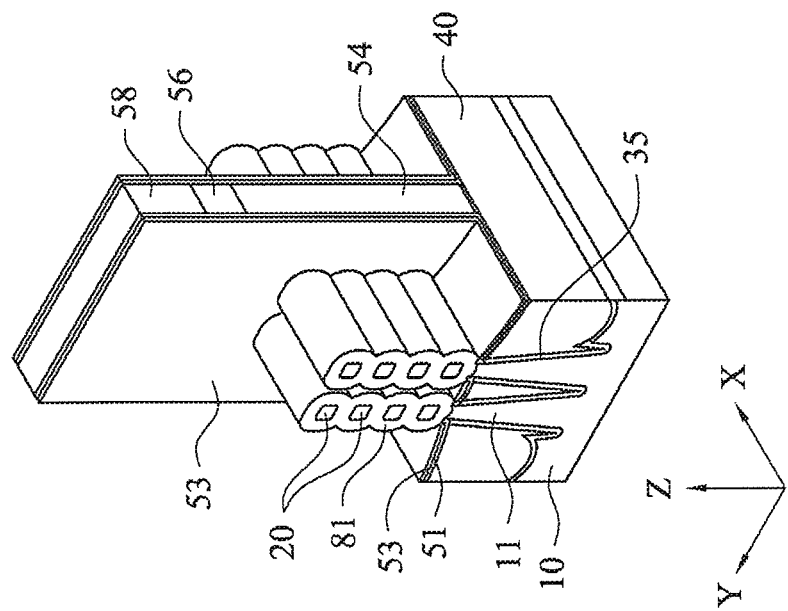
FIG. 25 shows one of the various stages of manufacturing a semiconductor FET device according to other embodiments of the present disclosure.

Subsequently, a source/drain epitaxial layer 81 is formed, as shown in FIG. 25. The source/drain epitaxial layer 81 includes one or more layers of Si, SiGe, Ge or any other suitable crystalline semiconductor material. The source/drain epitaxial layer 81 may contain boron. The source/drain epitaxial layers 81 are formed by an epitaxial growth method using CVD, ALD or molecular beam epitaxy (MBE). As shown in FIG. 25, the source/drain epitaxial layers grow from the recessed two fin structures. The source/drain epitaxial layer 81 wraps around each of the first semiconductor layers (wires) 20. In some embodiments, adjacent source/drain epitaxial layers 81 merge above the isolation insulating layer 40, and in other embodiments, source/drain epitaxial layer 81 are independently formed over the respective fin structures. The source/drain epitaxial layer 81 is formed in contact with the second cover layer 53 disposed over side faces of the sacrificial gate structure 50.

Figure 26B:
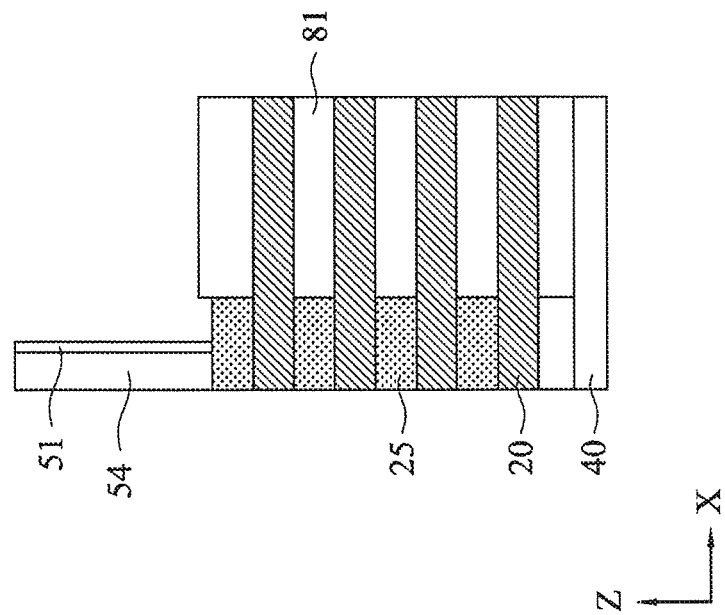
FIGS. 26A-26D show one of the various stages of manufacturing a semiconductor FET device according to embodiments of the present disclosure.
Figure 26A:
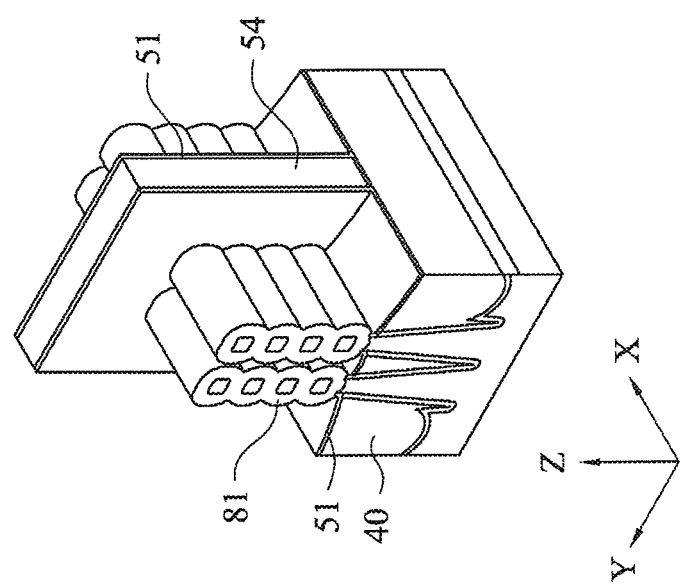
Figure 26C:
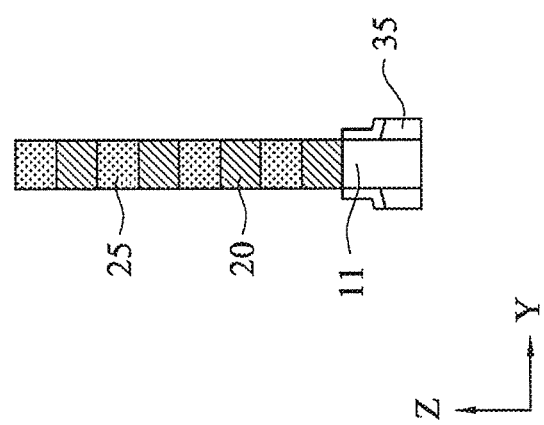
Figure 26D:
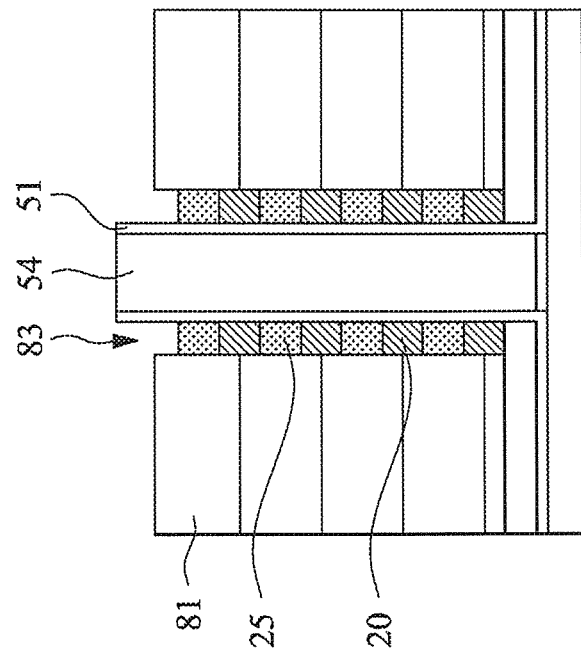

Subsequently, as shown in FIGS. 26A-26D, the second cover layer 53 is removed, by wet and/or dry etching. FIG. 26A is a perspective view, FIG. 26B is a cross sectional view along the X direction cutting one fin structure, FIG. 26C is a cross sectional view along the Y direction cutting a gap 83 of FIG. 26D, and FIG. 26D shows another perspective view.

When the second cover layer 53 is made of SiN, the second cover layer 53 can be selectively removed by using $H_3PO_4$. By removing the second cover layer 53, a gap 83 is formed between the source/drain epitaxial layer 81 and the first cover layer 51 disposed over the side faces of the sacrificial gate structure, as shown in FIG. 26D. As shown in FIG. 26D, a part of the structure is exposed from the gap 83. The space of the gap 83 is substantially the same as the thickness of the second cover layer 53.

Then, as shown in FIGS. 27A-27D, part of the second semiconductor layers 25 is removed in the gap 83 from the fin structure, and spaces 21 are formed between the first semiconductor layers 20. The second semiconductor layers 25 can be removed or etched using an etchant that can selectively etch the second semiconductor layers 25 against the first semiconductor layers 20.

Figure 27D:
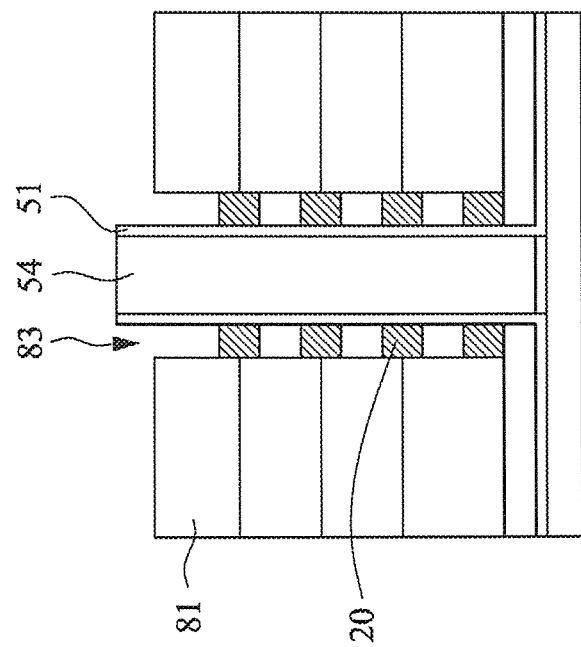
Figure 27C:
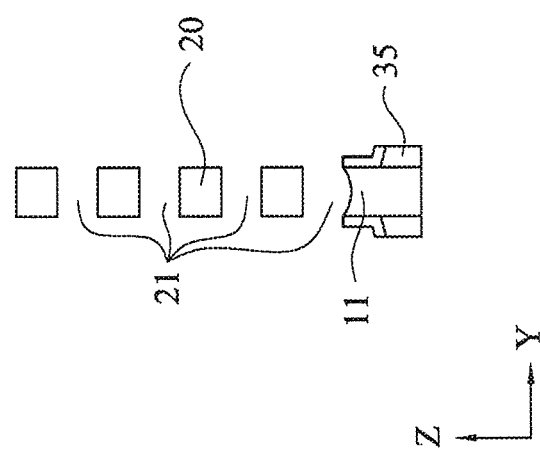

As shown in FIG. 27C, the remaining first semiconductor layers 20 have a rounded corner shape in some embodiments. Due to wet etching properties, the end face of the second semiconductor layers 25 has a convex shape, as shown in FIG. 27B, in some embodiments. By adjusting the etching time, it is possible to control the locations of the end faces of the second semiconductor layers 25.

Figure 28C:
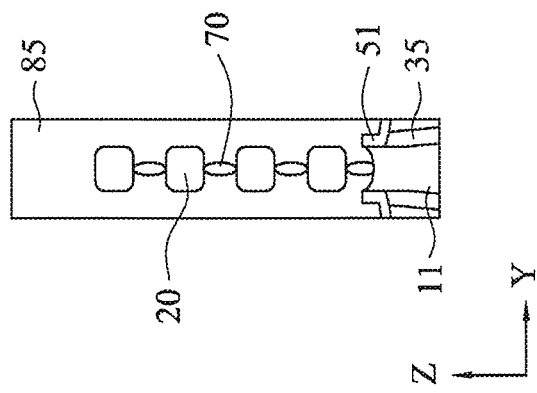
FIGS. 28A-28C show one of the various stages of manufacturing a semiconductor FET device according to embodiments of the present disclosure.
Figure 28B:
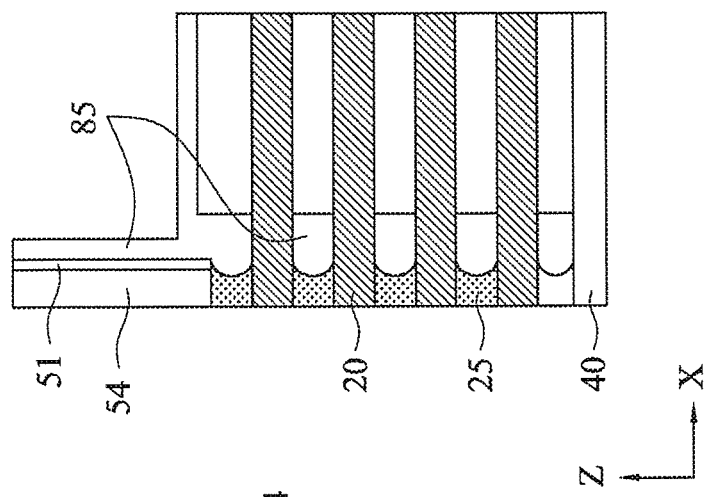
Figure 28A:
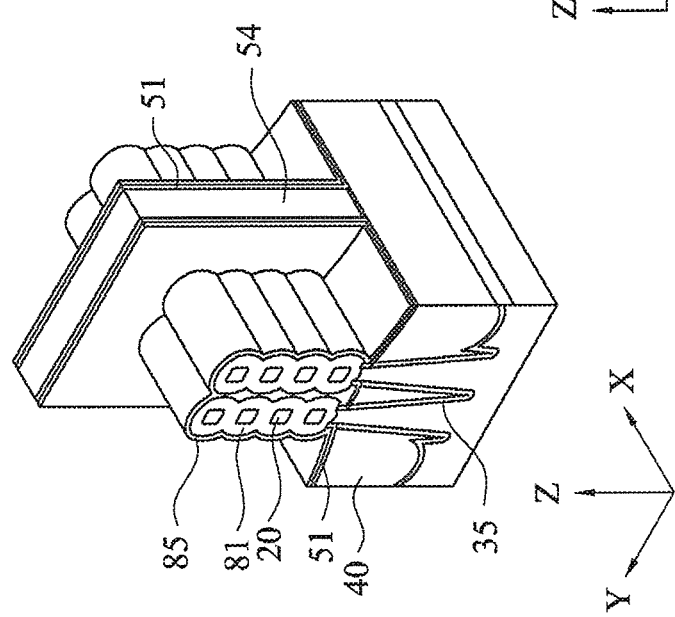

Next, as shown in FIGS. 28A-28C, an insulating layer 85 is formed over the structure shown in FIGS. 27A-27D. The insulating layer 85 can be formed by ALD or CVD or any other suitable method. By depositing the insulating layer 85, the spaces 21 are filled by the insulating material of the insulating layer 85, thereby forming inner spacers 85, as shown in FIG. 28B. In some embodiments, the insulating layer 85 includes a low-k dielectric material, such as SiOC and/or SiOCN or any other suitable dielectric material.

In some embodiments, as shown in FIG. 28C, one or more voids 70 are formed in the inner spacers 85. In certain embodiments, a part of the first semiconductor layer 20 is exposed to the void. In other embodiments, no part of the first semiconductor layer 20 is exposed to the void. In some embodiments, no voids are formed.

Figure 30:
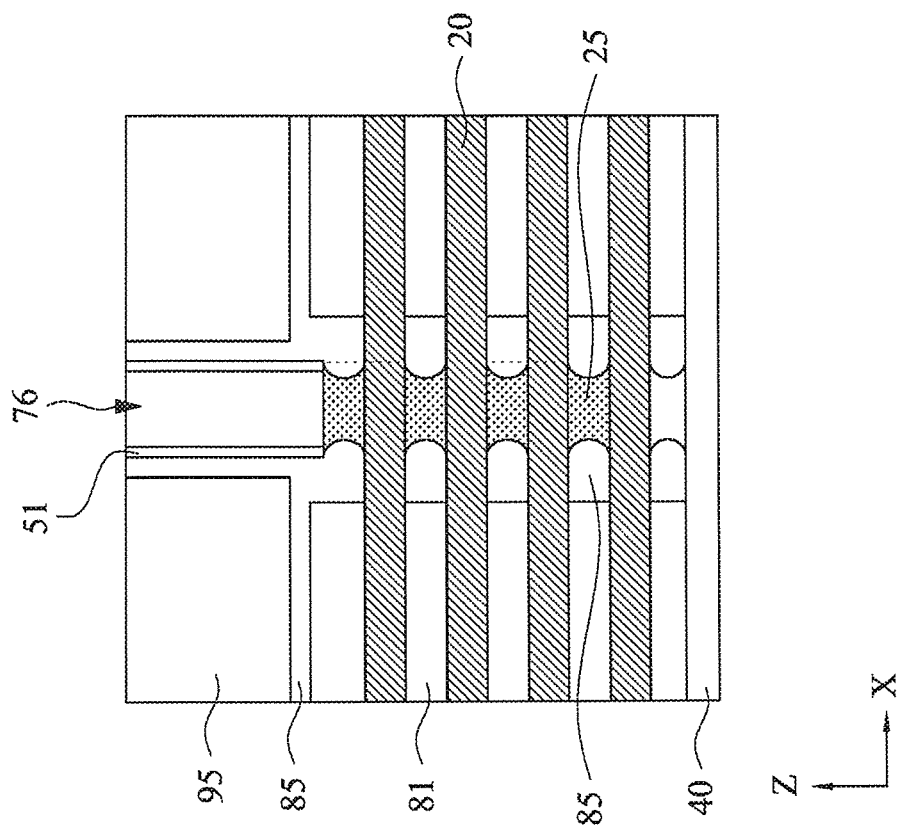
FIG. 30 shows one of the various stages of manufacturing a semiconductor FET device according to other embodiments of the present disclosure.
Figure 29:
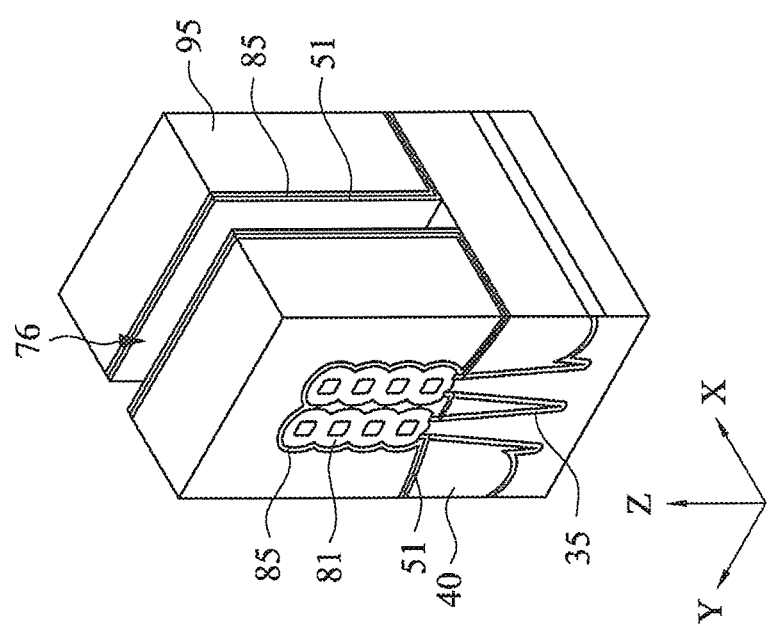
FIG. 29 shows one of the various stages of manufacturing a semiconductor FET device according to other embodiments of the present disclosure.

Subsequently, an interlayer dielectric (ILD) layer 95 is formed, as shown in FIG. 29. The materials for the ILD layer 95 include compounds comprising Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer is exposed. Then, the sacrificial gate electrode layer 54 and sacrificial gate dielectric layer 52 are removed, thereby forming a gate space 76, in which the channel regions of the fin structures are exposed, as shown in FIG. 30.

The ILD layer 95 protects the S/D structures 81 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

After the sacrificial gate structures are removed, the second semiconductor layers 25 in the fin structures are removed, thereby forming wires of the first semiconductor layers 20, as shown in FIG. 31. The second semiconductor layers 25 can be removed or etched using an etchant that can selectively etch the second semiconductor layers 25 against the first semiconductor layers 20, as set forth above.

After the semiconductor wires of the first semiconductor layers 20 are formed, a gate dielectric layer 102 is formed around each channel layers (wires of the second semiconductor layers 25), and a gate electrode layer 104 is formed on the gate dielectric layer 102, as shown in FIG. 32.

Subsequently, contact holes are formed in the ILD layer 95 by using dry etching. In some embodiments, the upper portion of the S/D epitaxial layer 81 is etched. In some embodiments, a silicide layer is formed over the S/D epitaxial layer 81. Then, a conductive material 130 is formed in the contact holes as shown in FIG. 17A. The conductive material 130 includes one or more of Co, Ni, W, Ti, Ta, Cu, Al, TiN and TaN. It is understood that the GAA FETs undergoes further CMOS processes to form various features such as contacts/vias, interconnect metal layers, dielectric layers, passivation layers, etc.

Figures 33A, 33B, 33C:
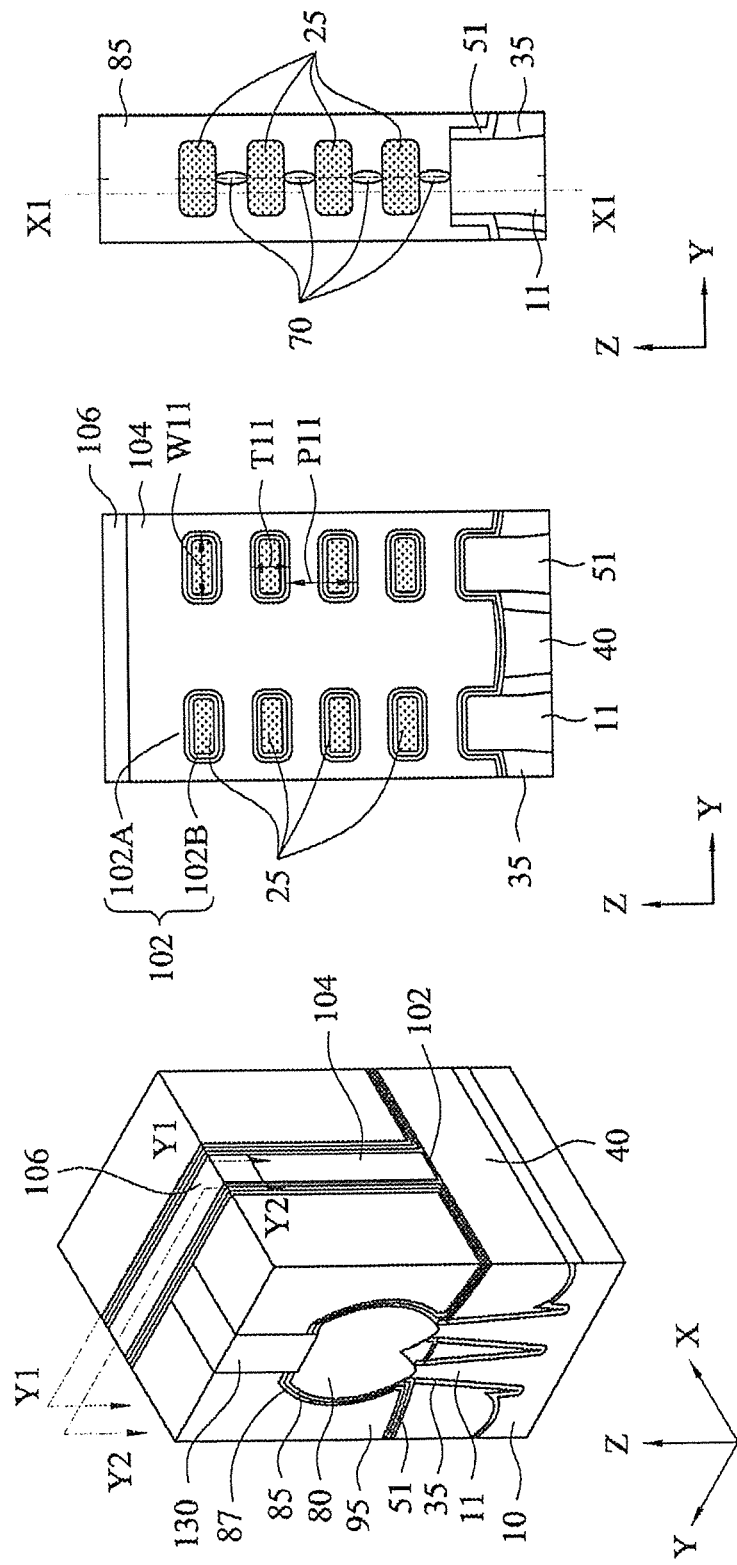
FIGS. 33A-33D show various views of a semiconductor FET device according to other embodiments of the present disclosure.
Figure 33D:
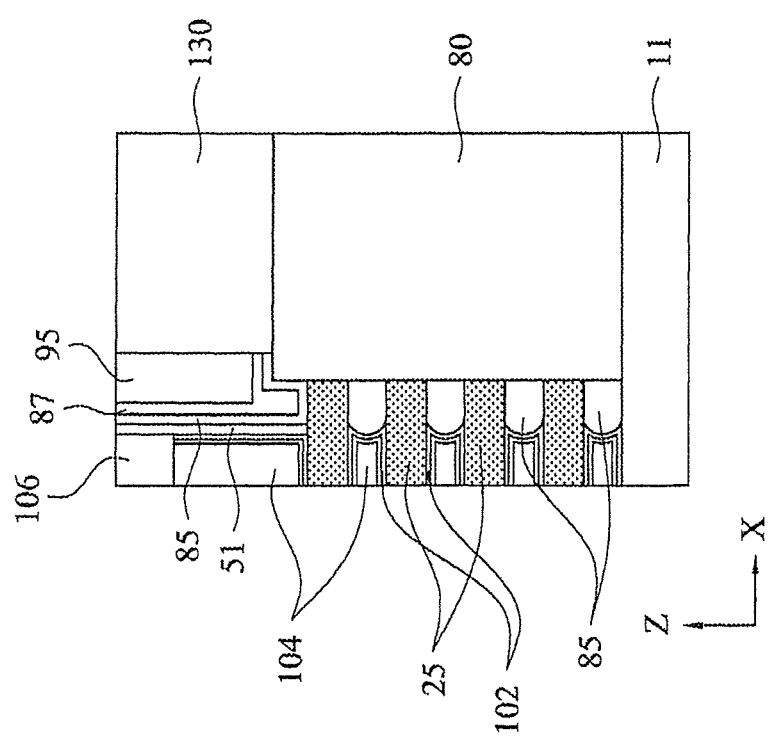
Figure 34B:
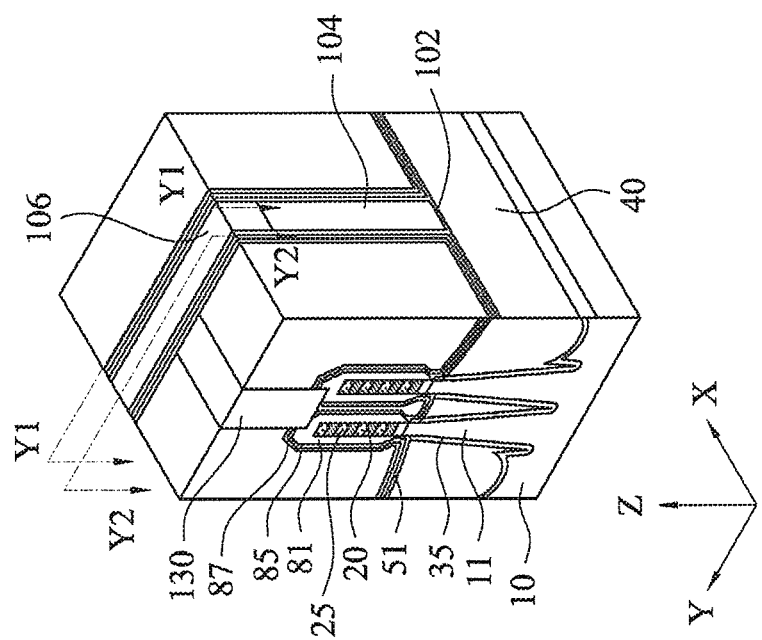
FIGS. 34A-34D show various views of a semiconductor FET device according to other embodiments of the present disclosure.
Figure 34A:
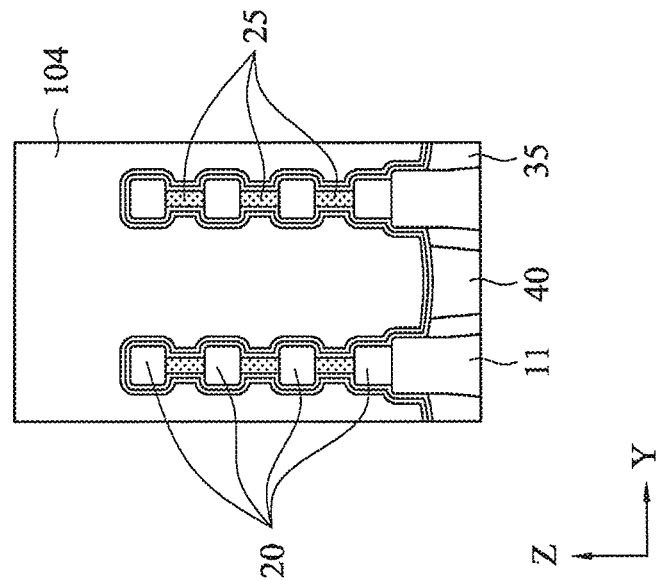
Figure 34D:
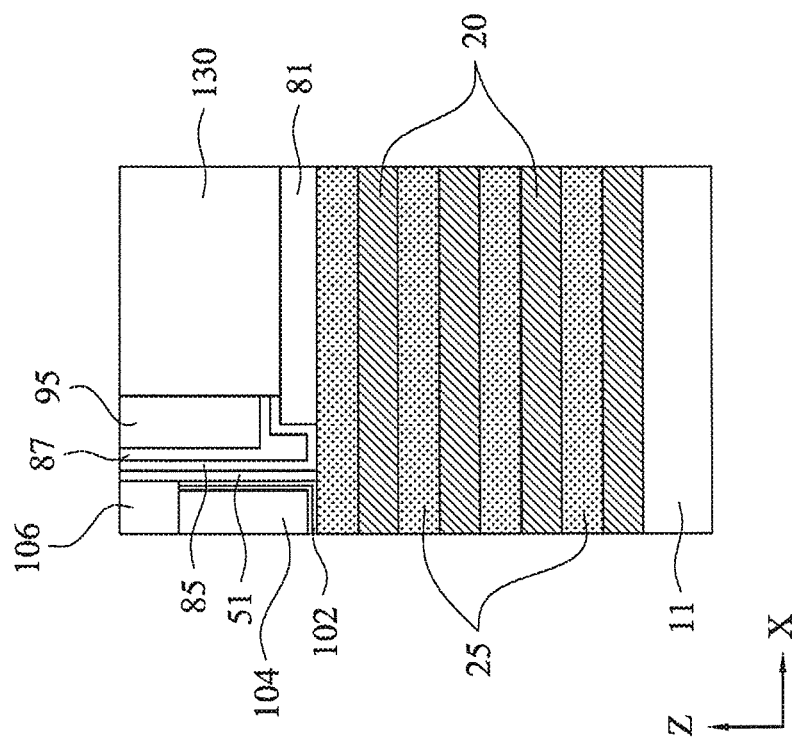
Figure 34C:
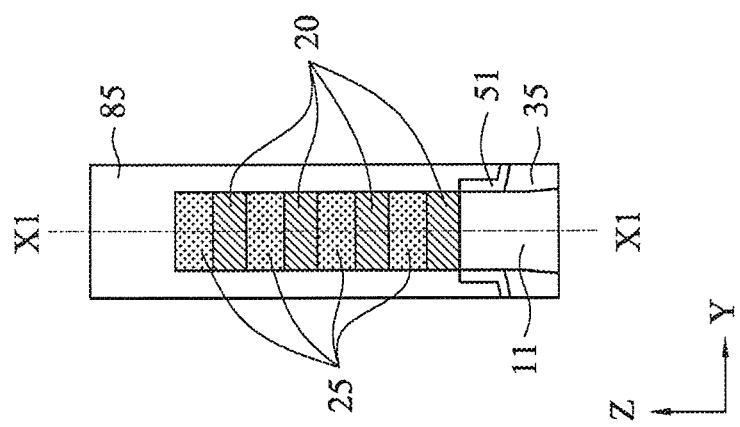

FIGS. 33A-33D show various views of a semiconductor FET device and FIGS. 34A-34D show various views of a semiconductor FET device according to other embodiments of the present disclosure. FIG. 33A is a perspective view, FIG. 33B is a cross sectional view corresponding to Y1-Y1 of FIG. 33A, FIG. 33C is a cross sectional view corresponding to Y2-Y2 of FIG. 33A, FIG. 33D shows a cross sectional view corresponding to X1-X1 of FIG. 33C. FIG. 34A is a perspective view, FIG. 34B is a cross sectional view corresponding to Y1-Y1 of FIG. 34A, FIG. 34C is a cross sectional view corresponding to Y2-Y2 of FIG. 34A, and FIG. 34D shows a cross sectional view corresponding to X1-X1 of FIG. 34C. Material, configuration, dimensions and/or processes the same as or similar to the foregoing embodiments described with respect to FIGS. 1A-32 may be employed in the following embodiments, and detailed explanation thereof may be omitted. The GAA FET shown in FIGS. 33A-33D and the FinFET shown in FIGS. 34A-34D are provided on the same substrate in some embodiments.

The GAA FET shown in FIGS. 33A-33D is substantially the same as the GAA FET shown in FIGS. 1A-1D, except that an etch-stop layer (ESL) 87 is further formed between the insulating layer 85 and the ILD layer 95. The ESL 87 includes one or more layers of insulating material, such as SiN and SiON, or any other suitable material, formed by ALD, CVD or any other suitable method. The GAA FET shown in FIGS. 33A-33D can be an n-type FET or a p-type FET.

In the GAA FET shown in FIGS. 33A-33D, the semiconductor wires of the channel region are made of the second semiconductor layers 25. In some embodiments, the cross sectional view of the second semiconductor layers 25 is a rectangular shape with rounded corners. In some embodiments, the width W11 of the second semiconductor layers 25 is in a range from about 5 nm to about 15 nm and the thickness T11 is in a range from about 1.5 nm to about 10 nm. The width W11 of the second semiconductor layers 25 is in a range from about 6 nm to about 10 nm and the thickness T11 is in a range from about 2 nm to about 6 nm, in other embodiments. The pitch P11 is in a range from about 5 nm to about 15 nm in some embodiments, and is in a range from about 8 nm to about 12 nm in other embodiments.

In the FinFET of FIGS. 34A-35E, the semiconductor FET is a p-type FinFET and the channel region includes the first semiconductor layers 20 and the second semiconductor layers 25. In some embodiments, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. Further, the structure of the source/drain region is different from that of the structures shown in FIGS. 1A-1D, FIGS. 17A-17D, or FIGS. 33A-33D. In the FinFET of FIGS. 34A-34D, the source/drain region includes the first semiconductor layers 20 and the second semiconductor layer 25 alternately stacked, and a source/drain epitaxial layer 81 wraps around the stacked source/drain structure.

As shown in FIGS. 34B and 34D, the channel region includes the first semiconductor layers 20 and the second semiconductor layer 25. The width of the second semiconductor layers 25 is smaller than the width of the first semiconductor layers 20. In some embodiments, the width in the Y direction of the first semiconductor layers 20 is in a range from about 3 nm to about 10 nm and the width in the Y direction of the second semiconductor layers 25 is in a range from about 1 nm to about 5 nm. In other embodiments, the width in the Y direction of the first semiconductor layers 20 is in a range from about 4 nm to about 6 nm and the width in the Y direction of the second semiconductor layers 25 is in a range from about 2 nm to about 4 nm. The difference in width between the first semiconductor layer 20 and the second semiconductor layers 25 is in a range from about 1 nm to about 3 nm in some embodiments.

FIGS. 35-40C show exemplary sequential processes for manufacturing the FinFET shown in FIGS. 34A-34D according to one embodiment of the present disclosure. It is understood that additional operations can be provided before, during, and after processes shown by FIGS. 35-40C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-34D may be employed in the following embodiments, and detailed explanation thereof may be omitted. The GAA FET of FIGS. 1A-1D, GAA FET of FIGS. 17A-17D and/or the GAA FET of FIGS. 33A-33D can be manufactured together with the FinFET shown in FIGS. 34A-34D.

Figure 35:
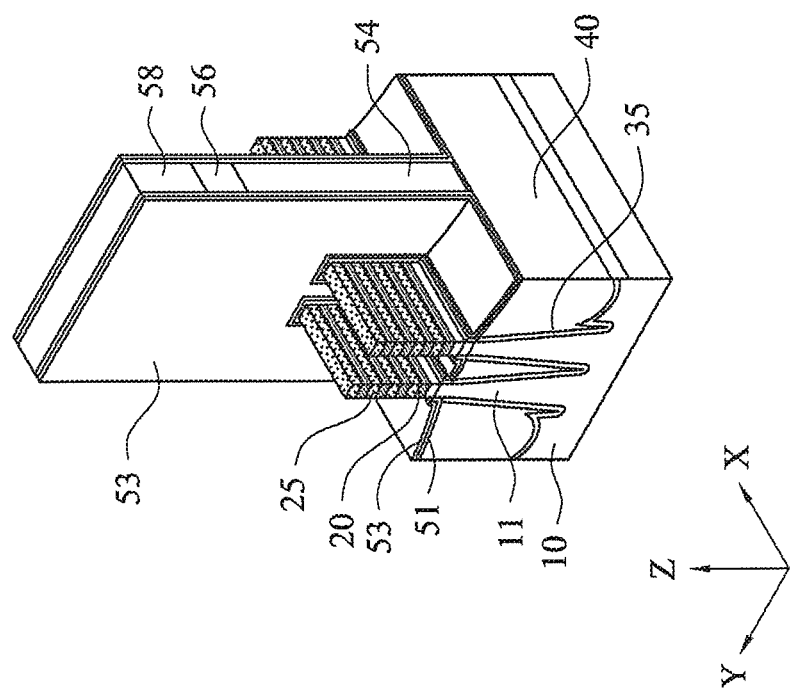
FIG. 35 shows one of the various stages of manufacturing a semiconductor FET device according to other embodiments of the present disclosure.

After the structure shown in FIG. 23 is formed, the second cover layer 53 and the first cover 51 disposed over the source/drain region of the fin structure are removed, as show in FIG. 35.

Figure 36:
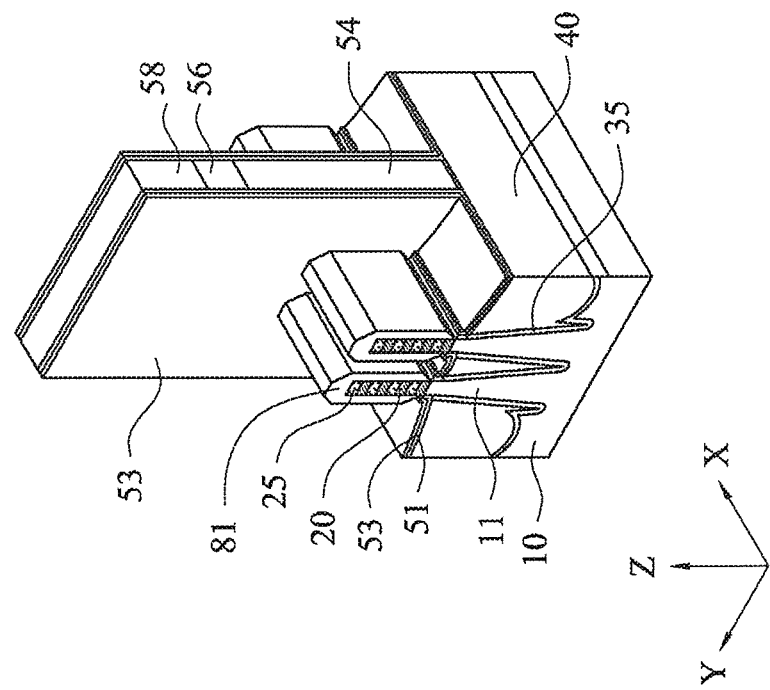
FIG. 36 shows one of the various stages of manufacturing a semiconductor FET device according to other embodiments of the present disclosure.

Subsequently, a source/drain epitaxial layer 81 is formed, as shown in FIG. 36. The source/drain epitaxial layer 81 includes one or more layers of Si, SiGe, Ge or any other suitable crystalline semiconductor material. The source/drain epitaxial layer 81 may contain boron (B). The source/drain epitaxial layers 81 are formed by an epitaxial growth method using CVD, ALD or molecular beam epitaxy (MBE). As shown in FIG. 36, the source/drain epitaxial layers grow from the recessed two fin structure of two fin structures. The source/drain epitaxial layer 81 wraps around each of the upper portions of the fin structures. In some embodiments, adjacent source/drain epitaxial layers 81 merge above the isolation insulating layer 40, and in other embodiments, source/drain epitaxial layer 81 are independently formed over the respective fin structures. The source/drain epitaxial layer 81 is formed in contact with the second cover layer disposed over side faces of the sacrificial gate structure.

Figures 37A, 37B, 37C:
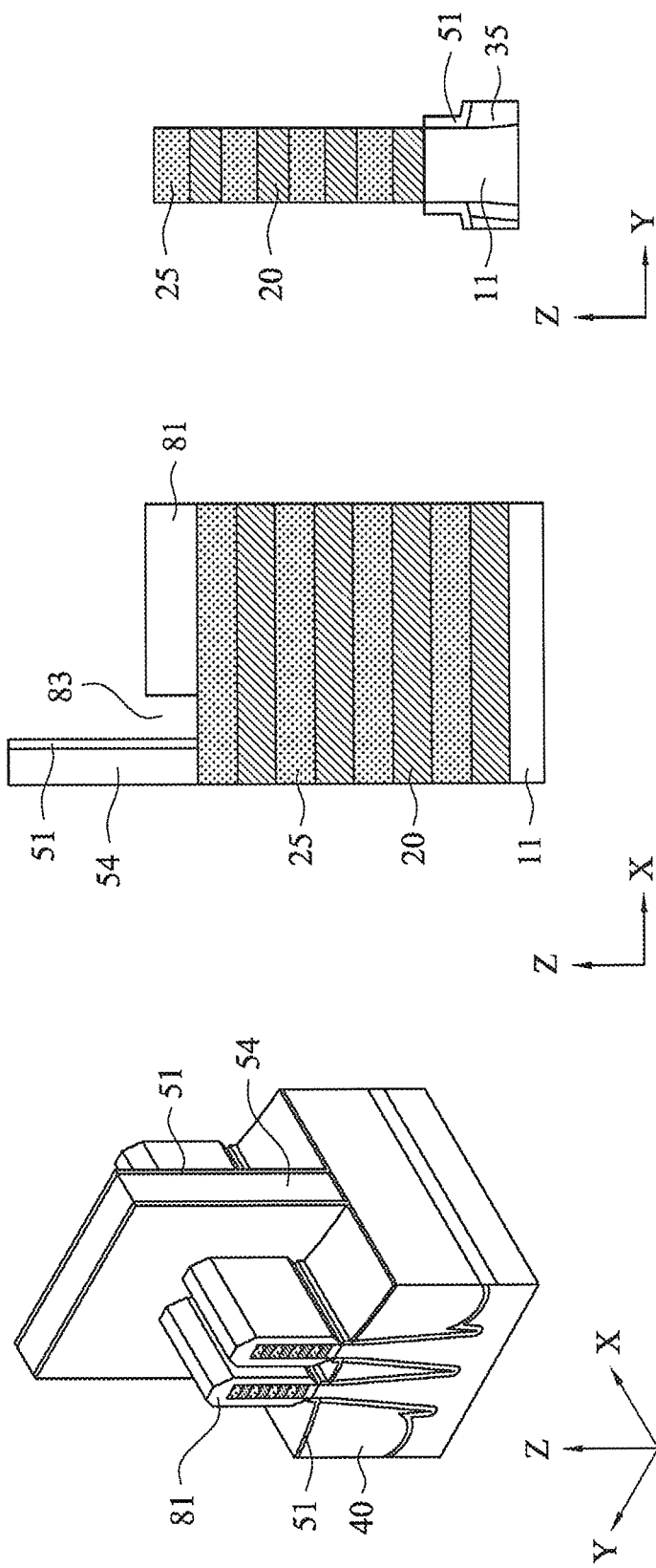
FIGS. 37A-37C show one of the various stages of manufacturing a semiconductor FET device according to embodiments of the present disclosure.

Then, as shown in FIGS. 37A-37C, the second cover layer 53 is removed, by wet and/or dry etching. FIG. 37A is a perspective view, FIG. 37B is a cross sectional view along the X direction cutting one fin structure, and FIG. 37C is a cross sectional view along the Y direction cutting a gap 83 of FIG. 26D.

When the second cover layer 53 is made of SiN, the second cover layer 53 can be selectively removed by using $H_3PO_4$. By removing the second cover layer 53, a gap 83 is formed between the source/drain epitaxial layer 83 and the first cover layer 51 disposed over the side faces of the sacrificial gate structure, as shown in FIG. 37B. As shown in FIG. 37B, a part of the fin structure is exposed from the gap 83.

Next, as shown in FIGS. 38A-38C, an insulating layer 85 is formed over the structure shown in FIGS. 37A-37D. The insulating layer 85 can be formed by ALD or CVD or any other suitable method. In some embodiments, the insulating layer 85 includes a low-k dielectric material, such as SiOC and/or SiOCN or any other suitable dielectric material.

Subsequently, an interlayer dielectric (ILD) layer 95 is formed, as shown in FIGS. 39A-39C. In some embodiments, before forming the ILD layer 95, an etch-stop layer (ESL) 87 is formed over the insulating layer 85. The ESL 87 includes one or more layers of insulating material, such as SiN and SiON, or any other suitable material, formed by ALD, CVD or any other suitable method.

The materials for the ILD layer 95 include compounds comprising Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer 54 is exposed. Then, the sacrificial gate electrode layer 54 and sacrificial gate dielectric layer 52 are removed, thereby forming a gate space 76, in which the channel regions of the fin structures are exposed, as shown in FIGS. 39A-39C.

After the sacrificial gate structures are removed, the second semiconductor layers 25 in the fin structures are partially removed, as shown in FIG. 39C. The second semiconductor layers 25 can be etched using an etchant that can selectively etch the second semiconductor layers 25 against the first semiconductor layers 20, as set forth above.

After the semiconductor wires of the first semiconductor layers 20 are formed, a gate dielectric layer 102 is formed over the channel layer including the first semiconductor layers 20 and the second semiconductor layers 25, and a gate electrode layer 104 is formed on the gate dielectric layer 102, as shown in FIGS. 40A-40C.

Subsequently, contact holes are formed in the ILD layer 95 by using dry etching. In some embodiments, the upper portion of the S/D epitaxial layer 81 is etched. In some embodiments, a silicide layer is formed over the S/D epitaxial layer 81. Then, a conductive material 130 is formed in the contact holes as shown in FIGS. 34A-34D. The conductive material 130 includes one or more of Co, Ni, W, Ti, Ta, Cu, Al, TiN and TaN. It is understood that the FETs undergoes further CMOS processes to form various features such as contacts/vias, interconnect metal layers, dielectric layers, passivation layers, etc.

The various embodiments or examples described herein offer several advantages over the existing art. For example, in the present disclosure, since the inner spacers 85 are formed after the source/drain epitaxial layer is formed, the inner spacers can be formed in a self-align manner. With the foregoing embodiments, it is possible to more precisely control the thickness, the shape and/or the location of the inner spacers and thus to control capacitances around the source/drain and the gate.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure in which first semiconductor layers and second semiconductor layers are alternately stacked is formed. A sacrificial gate structure is formed over the fin structure. A first cover layer is formed over the sacrificial gate structure, and a second cover layer is formed over the first cover layer. A source/drain epitaxial layer is formed on opposing sides of the sacrificial gate structure. After the source/drain epitaxial layer is formed, the second cover layer is removed, thereby forming a gap between the source/drain epitaxial layer and the first cover layer, from which a part of the fin structure is exposed. Part of the first semiconductor layers is removed in the gap, thereby forming spaces between the second semiconductor layers. The spaces are filled with a first insulating material. In one or more of the foregoing and following embodiments, one or more voids are formed in the first insulating material between the second semiconductor layers. In one or more of the foregoing and following embodiments, the first insulating material is a low-k dielectric material. In one or more of the foregoing and following embodiments, the first insulating material is further formed on the source/drain epitaxial layer and the first cover layer. In one or more of the foregoing and following embodiments, the first cover layer is made of a first dielectric material and the second cover layer is made of a second dielectric material different from the first dielectric material. In one or more of the foregoing and following embodiments, the first dielectric material is a low-k dielectric material. In one or more of the foregoing and following embodiments, the forming the source/drain epitaxial layer includes recessing a part of the fin structure not covered by the sacrificial gate structure, and forming a third semiconductor layer over the recessed fin structure as the source/drain epitaxial layer. The third semiconductor layer is made of a different semiconductor material than the second semiconductor layers. In one or more of the foregoing and following embodiments, after the first insulating material is formed, the sacrificial gate structure is removed, thereby exposing a part of the fin structure. The first semiconductor layers are removed from the exposed fin structure, thereby forming channel layers including the second semiconductor layers. A gate dielectric layer and a gate electrode layer are formed around the channel layers. In one or more of the foregoing and following embodiments, the gate electrode layer is in contact with the first insulating material and isolated from the source/drain epitaxial layer by the first insulating material. In one or more of the foregoing and following embodiments, the first semiconductor layer is made of SiGe, and the second semiconductor layer is made of Si.

In accordance with another aspect of the present disclosure, in a method of manufacturing a semiconductor device, a fin structure in which first semiconductor layers and second semiconductor layers are alternately stacked is formed. A sacrificial gate structure is formed over the fin structure. A first cover layer is formed over the sacrificial gate structure, and a second cover layer is formed over the first cover layer. The second semiconductor layers are removed from a part of the fin structure not covered by the sacrificial gate structure, thereby forming source/drain layers made by the first semiconductor layers. A source/drain epitaxial layer is formed over the source/drain layers. After the source/drain epitaxial layers are formed, the second cover layer is removed, thereby forming a gap between the source/drain epitaxial layer and the first cover layer, from which a part of the fin structure is exposed. Part of the second semiconductor layers in the gap is removed, thereby forming spaces between the first semiconductor layers. The spaces are filled with a first insulating material. In one or more of the foregoing and following embodiments, one or more voids are formed in the first insulating material between the first semiconductor layers. In one or more of the foregoing and following embodiments, the first insulating material is further formed on the source/drain epitaxial layer and the first cover layer. In one or more of the foregoing and following embodiments, the first cover layer is made of a first dielectric material and the second cover layer is made of a second dielectric material different from the first dielectric material. In one or more of the foregoing and following embodiments, after the first insulating material is formed, the sacrificial gate structure is removed, thereby exposing a part of the fin structure. The second semiconductor layers are removed from the exposed fin structure, thereby forming channel layers made by the first semiconductor layers. A gate dielectric layer and a gate electrode layer are formed around the channel layers. In one or more of the foregoing and following embodiments, the gate electrode layer is in contact with the first insulating material and isolated from the source/drain epitaxial layer by the first insulating material. In one or more of the foregoing and following embodiments, the first semiconductor layer is made of SiGe, and the second semiconductor layer is made of Si.

In accordance with another aspect of the present disclosure, in a method of manufacturing a semiconductor device, a fin structure in which first semiconductor layers and second semiconductor layers are alternately stacked is formed. A sacrificial gate structure is formed over the fin structure. A first cover layer is formed over the sacrificial gate structure, and a second cover layer is formed over the first cover layer. The first and second cover layers are removed from a source/drain region of the fin structure, which is not covered by the sacrificial gate structure, thereby exposing the source/drain region of the fin structure. A source/drain epitaxial layer is formed over the source/drain region. A first insulating layer is formed over the source/drain epitaxial layer and the first cover layer. An etch-stop layer is formed over the first insulating layer. An interlayer dielectric layer is formed over the etch-stop layer. In one or more of the foregoing and following embodiments, after the interlayer dielectric layer is formed, the sacrificial gate structure is removed, thereby exposing a part of the fin structure. The second semiconductor layers are partially removed from the exposed fin structure, thereby forming channel layers including the first semiconductor layers and the second semiconductor layers having thinner widths than the first semiconductor layers. A gate dielectric layer and a gate electrode layer are formed around the channel layers. In one or more of the foregoing and following embodiments, the first insulating layer is made of a low-k dielectric material.

In accordance with one aspect of the present disclosure, a semiconductor device includes first semiconductor wires disposed over a substrate, a first source/drain region in contact with ends of the first semiconductor wires, a gate dielectric layer disposed on and wrapping around each channel region of the first semiconductor wires, a gate electrode layer disposed on the gate dielectric layer and wrapping around the each channel region, and first insulating spacers disposed in spaces, respectively. The spaces are defined by adjacent first semiconductor wires, the gate electrode layer and the first source/drain region. End faces of the first insulating spacers in contact with the first source/drain region are vertically aligned. In one or more of the foregoing and following embodiments, the end faces of the first insulating spacers in contact with the first source/drain region and interface between the ends of the first semiconductor wires and the first source/drain region are vertically aligned. In one or more of the foregoing and following embodiments, one or more voids are formed in the first insulating spaces between the first semiconductor wires. In one or more of the foregoing and following embodiments, the first insulating spacers are made of a low-k dielectric material. In one or more of the foregoing and following embodiments, the low-k dielectric material includes at least one selected from the group consisting of SiOC and SiOCN. In one or more of the foregoing and following embodiments, a first insulating layer is formed over the source/drain region and over side faces of the gate electrode layer, and the first insulating layer is made of a same material as and formed at a same time as the first insulating spacers. In one or more of the foregoing and following embodiments, the semiconductor device further includes a cover layer disposed between the side faces of the gate electrode layer and the first insulating layer. In one or more of the foregoing and following embodiments, the source/drain region and the first cover layer are separated by the first insulating layer.

In accordance with another aspect of the present disclosure, a semiconductor device includes first semiconductor wires disposed over a substrate, a first source/drain epitaxial layer wrapping around source/drain regions of the first semiconductor wires, a gate dielectric layer disposed on and wrapping around each channel region of the first semiconductor wires, a gate electrode layer disposed on the gate dielectric layer and wrapping around the each channel region, and first insulating spacers disposed in spaces, respectively. The spaces are defined by adjacent first semiconductor wires, the gate electrode layer and the first source/drain region. End faces of the first insulating spacers in contact with the first source/drain region are vertically aligned. In one or more of the foregoing and following embodiments, the first semiconductor wires are made of SiGe or Ge. In one or more of the foregoing and following embodiments, one or more voids are formed in the first insulating spaces between the first semiconductor wires. In one or more of the foregoing and following embodiments, the first insulating spacers include at least one selected from the group consisting of SiOC and SiOCN. In one or more of the foregoing and following embodiments, a first insulating layer is formed over the source/drain epitaxial layer and over side faces of the gate electrode layer, and the first insulating layer is made of a same material as and formed at a same time as the first insulating spacers. In one or more of the foregoing and following embodiments, the semiconductor device further includes a cover layer disposed between the side faces of the gate electrode layer and the first insulating layer. In one or more of the foregoing and following embodiments, the source/drain region and the first cover layer are separated by the first insulating layer. In one or more of the foregoing and following embodiments.

In accordance with another aspect of the present disclosure, a semiconductor device includes a first field effect transistor (FET) and a second FET. The first FET includes first semiconductor wires disposed over a substrate, a first source/drain epitaxial layer in contact with ends of the first semiconductor wires, a first gate dielectric layer disposed on and wrapping around each channel region of the first semiconductor wires, a first gate electrode layer disposed on the first gate dielectric layer and wrapping around the each channel region, and first insulating spacers disposed in spaces, respectively. The spaces are defined by adjacent first semiconductor wires, the first gate electrode layer and the first source/drain epitaxial layer. The second FET includes a fin structure in which first semiconductor layer and second semiconductor layer are alternately stacked, a second source/drain epitaxial layer disposed over a source/drain region of the fin structure, a second gate dielectric layer disposed over a channel region of the fin structure, and a second gate electrode layer disposed on the second gate dielectric layer. In one or more of the foregoing and following embodiments, the first FET is an n-type FET and the second FET is a p-type FET. In one or more of the foregoing and following embodiments, end faces of the first insulating spacers in contact with the first source/drain epitaxial layer are vertically aligned. In one or more of the foregoing and following embodiments, one or more voids are formed in the first insulating spaces between the first semiconductor wires. In one or more of the foregoing and following embodiments, widths of the first semiconductor layers in the channel region are smaller than width of the second semiconductor layers in the channel region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first structure disposed over a semiconductor substrate;
a second structure disposed over the semiconductor substrate;
an isolation insulating layer disposed between the first structure and the second structure,
wherein the first structure comprises:
a stacked plurality of semiconductor wires;
a first source/drain epitaxial layer in contact with ends of the semiconductor wires;
a first gate dielectric layer disposed on and wrapping around a channel region of each of the semiconductor wires;
a first gate electrode layer disposed on the first gate dielectric layer and wrapping around the channel region of each of the semiconductor wires;
a cover layer disposed over a sidewall of a portion of the first gate electrode layer above the channel region;
insulating spacers disposed between adjacent semiconductor wires, the first gate electrode layer, and the first source/drain epitaxial layer, and the second structure comprises:
a fin structure in which a first semiconductor layer and a second semiconductor layer are alternately stacked;
a second source/drain epitaxial layer disposed over a source/drain region of the fin structure;
a second gate dielectric layer disposed over a channel region of the fin structure; and
a second gate electrode layer disposed on the second gate dielectric layer,
an interlayer dielectric layer disposed over the first and second source/drain epitaxial layers; and
a low-k dielectric layer disposed between the interlayer dielectric layer and the first and second gate electrode layers.

2. The semiconductor device of claim 1, wherein the first structure is an n-type field effect transistor (FET) and the second structure is a p-type FET.

3. The semiconductor device of claim 1, wherein end faces of the insulating spacers in contact with the first source/drain epitaxial layer are vertically aligned.

4. The semiconductor device of claim 1, wherein one or more voids are formed in the insulating spacers between the semiconductor wires.

5. The semiconductor device of claim 1, wherein widths of the first semiconductor layers in the channel region are smaller than widths of the second semiconductor layers in the channel region.

6. The semiconductor device of claim 1, wherein a periphery of each of the insulating spacers forms right angles where the first source/drain epitaxial layer and the semiconductor wires meet.

7. The semiconductor device of claim 1, wherein the low-k dielectric layer is made of SiOC or SiOCN.

8. The semiconductor device of claim 1, wherein the semiconductor wires are made of Si, SiGe, or Ge.

9. The semiconductor device of claim 1, wherein the first and second semiconductor layers are made of different materials selected from Si, SiGe, or Ge.

10. A semiconductor device, comprising:
a first field effect transistor (FET) and a second FET, wherein the first FET comprises:
a plurality of silicon semiconductor wires stacked over a substrate;
a first source/drain epitaxial layer in contact with ends of the silicon semiconductor wires;
a first gate dielectric layer disposed on and wrapping around a channel region of each of the silicon semiconductor wires;
a first gate electrode layer disposed on the first gate dielectric layer and wrapping around the channel region of each of the silicon semiconductor wires;
a cover layer disposed over a sidewall of a portion of the first gate electrode layer above the channel region;
insulating spacers comprising a spacer material in direct contact with the first source/drain epitaxial layer and the silicon semiconductor wires, wherein a periphery of the insulating spacers forms substantial right angles where the first source/drain epitaxial layer and the silicon semiconductor wires meet, and the second FET comprises:
a fin-like structure;
a second gate electrode layer disposed over a channel region of the fin-like structure; and
a second source/drain epitaxial layer disposed over a source/drain region of the fin-like structure, an interlayer dielectric layer disposed over the first and second source/drain epitaxial layers; and a low-k dielectric layer disposed between the interlayer dielectric layer and the first and second gate electrode layers.

11. The semiconductor device of claim 10, wherein the first FET is an n-type FET and the second FET is a p-type FET.

12. The semiconductor device of claim 10, wherein the fin-like structure includes alternately stacked first semiconductor layers made of Si and second semiconductor layers made of SiGe.

13. The semiconductor device of claim 12, further comprising an insulating layer formed of the spacer material in direct contact with the first semiconductor layers and the second semiconductor layers.

14. The semiconductor device of claim 12, wherein widths of the first semiconductor layers in the channel region are smaller than widths of the second semiconductor layers in the channel region.

15. The semiconductor device of claim 10, wherein one or more voids are formed in the insulating spacers between the silicon semiconductor wires.

16. The semiconductor device of claim 10, wherein the low-k dielectric layer is made of SiOC or SiOCN.

17. A semiconductor device, comprising:
an n-type field effect transistor (NFET) and a p-type field effect transistor (PFET), wherein the NFET comprises:
a plurality of semiconductor wires stacked over a substrate;
a first source/drain epitaxial layer in contact with ends of the semiconductor wires;
a first gate dielectric layer disposed on and wrapping around a channel region of each of the semiconductor wires;
a first gate electrode layer disposed on the first gate dielectric layer and wrapping around the channel region of each of the semiconductor wires;
a cover layer disposed over a sidewall of a portion of the first gate electrode layer above the channel region; and
insulating spacers comprising a spacer material filling a space between the first source/drain epitaxial layer, the first gate dielectric layer, and the semiconductor wires, wherein the space has right angle boundaries where the first source/drain epitaxial layer and the semiconductor wires meet, wherein the spacer material is disposed over the cover layer, and wherein the PFET comprises:
a fin structure in which first semiconductor layers and second semiconductor layers are alternately stacked; and
a second gate electrode layer disposed over a channel region of the fin structure.

18. The semiconductor device of claim 17, further comprising an insulating layer formed of the spacer material in direct contact with the first semiconductor layers and the second semiconductor layers.

19. The semiconductor device of claim 17, further comprising an isolation insulating layer disposed between the NFET and the PFET.

20. The semiconductor device of claim 17, wherein the semiconductor wires are made of Si, Site, or Ge.

* * * * *